US010935330B2

(12) United States Patent
Subramanyam et al.

(10) Patent No.: US 10,935,330 B2
(45) Date of Patent: Mar. 2, 2021

(54) HEAT EXCHANGERS CAPABLE OF BIDIRECTIONAL FLUID FLOW

(71) Applicant: Senior UK Limited, Gwent (GB)

(72) Inventors: Ragu Subramanyam, Blackwood (GB); Adrián Loureiro Fernández, Cardiff (GB)

(73) Assignee: Senior UK Limited, Crumlin (GB)

( * ) Notice: Subject to any disclaimer, the term of this patent is extended or adjusted under 35 U.S.C. 154(b) by 162 days.

(21) Appl. No.: 16/359,555

(22) Filed: Mar. 20, 2019

(65) Prior Publication Data

US 2020/0300488 A1    Sep. 24, 2020

(51) Int. Cl.
*F28F 3/02* (2006.01)
*F28F 3/08* (2006.01)
*F24F 11/30* (2018.01)
*H01L 23/46* (2006.01)

(52) U.S. Cl.
CPC .............. *F28F 3/025* (2013.01); *F24F 11/30* (2018.01); *F28F 3/08* (2013.01); *F25B 2313/027* (2013.01); *F25B 2341/061* (2013.01); *H01L 23/46* (2013.01)

(58) Field of Classification Search
CPC .............. F28F 3/025; F28F 3/08; H01L 23/46
See application file for complete search history.

(56) References Cited

U.S. PATENT DOCUMENTS

| 5,005,640 A * | 4/1991 | Lapinski .............. F28D 9/00 165/142 |
| 6,895,026 B2 * | 5/2005 | Miyajima ............. H01L 23/473 257/E23.098 |
| 8,951,655 B2 | 2/2015 | Chung et al. |
| 8,968,904 B2 | 3/2015 | Han et al. |

(Continued)

FOREIGN PATENT DOCUMENTS

DE    102012006122 A1    9/2013

OTHER PUBLICATIONS

Wang, et al., "Characteristics of flow distribution in compact parallel flow heat exchangers, part I: Typical inlet header," Applied Thermal Engineering 31 (2011) 3226-3234.

(Continued)

*Primary Examiner* — Devon Russell
(74) *Attorney, Agent, or Firm* — Greenberg Traurig, LLP

(57) ABSTRACT

A heat exchanger for regulating the temperature of objects includes two coolant ports that can interchangeably serve as either a coolant inlet or a coolant outlet. The heat exchanger includes sealedly engaged top, middle, and bottom plates that form passageways that distribute coolant through the heat exchanger. A top manifold is formed between the top and middle plates and is fluidly coupled with a first port, while a bottom manifold is formed between the bottom and middle plates and is fluidly coupled with a second port. The top and bottom manifolds are configured such that, during operation, coolant can be directed from the first port to the second port, or vice versa, thereby enabling the heat (Continued)

exchanger to operate bidirectionally—without materially affecting the temperature regulation effects of the heat exchanger. In this manner, the same heat exchanger construction can be used in multiple orientations within a thermal management system.

23 Claims, 19 Drawing Sheets
(2 of 19 Drawing Sheet(s) Filed in Color)

(56) References Cited

U.S. PATENT DOCUMENTS

| | | |
|---|---|---|
| 8,999,548 B2 | 4/2015 | Sun et al. |
| 9,028,989 B2 | 5/2015 | Zhang et al. |
| 9,379,420 B2 | 6/2016 | Ketkar et al. |
| 9,441,681 B2 | 9/2016 | Williams |
| 9,614,206 B2 | 4/2017 | Choi et al. |
| 10,006,722 B2 * | 6/2018 | Kenney .................... F28F 3/08 |
| 10,801,789 B2 * | 10/2020 | Subramanyam .. H01M 10/6567 |
| 2016/0204486 A1 * | 7/2016 | Kenney .................... F28F 3/12 |
| | | 429/120 |
| 2016/0315365 A1 * | 10/2016 | Vanderwees ...... H01M 10/6557 |
| 2017/0051987 A1 | 2/2017 | Vanerwees et al. |

OTHER PUBLICATIONS

Wang, et al., "Characteristics of flow distribution in compact parallel flow heat exchangers, part II: Modified inlet header," Applied Thermal Engineering 31 (2011) 3235-3242.
Office Action dated Jan. 10, 2018 from Vanderwees U.S. Appl. No. 15/135,066, filed Apr. 21, 2016, nine (9) pages.

* cited by examiner

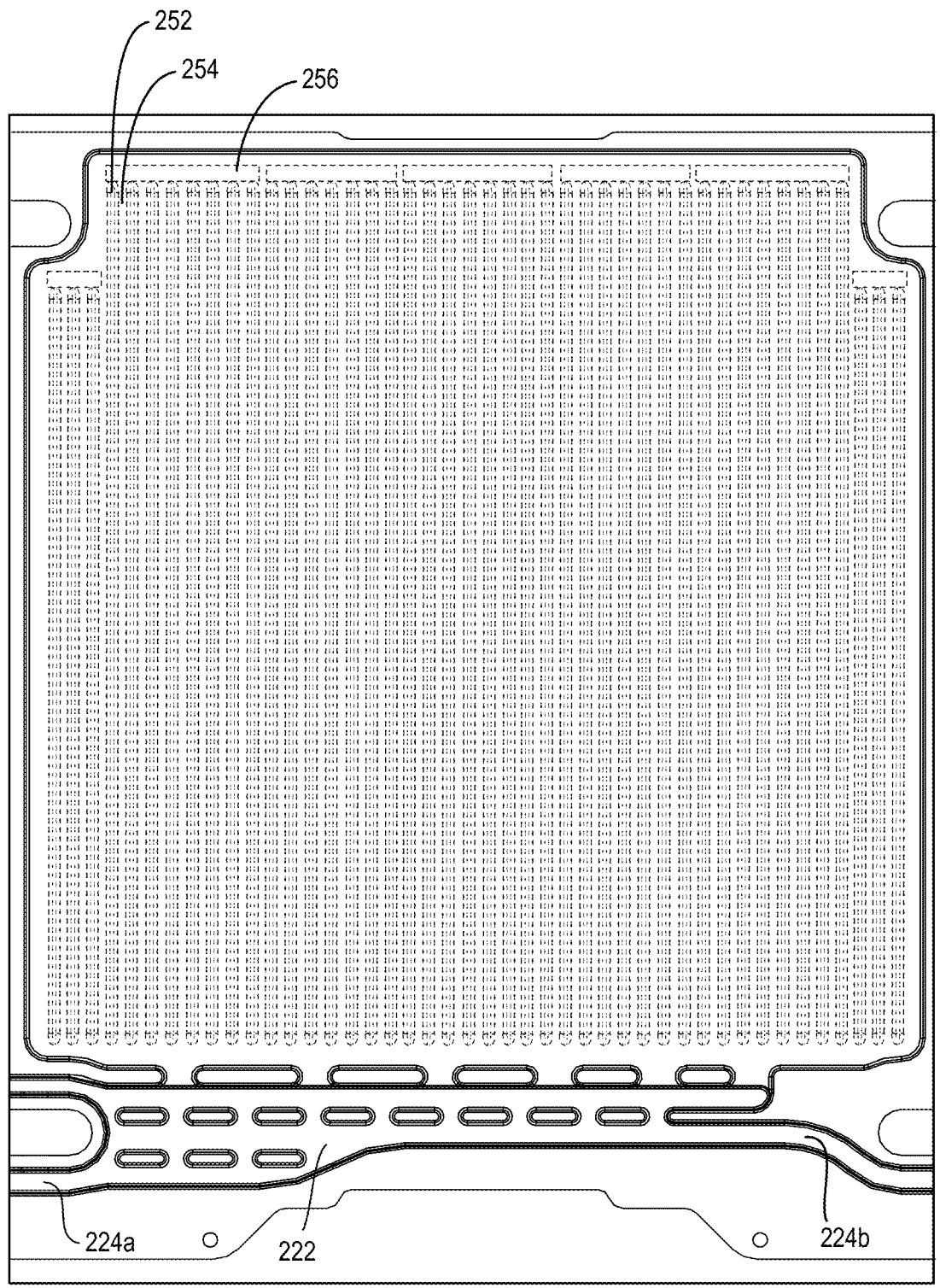
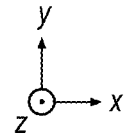
FIG. 5D

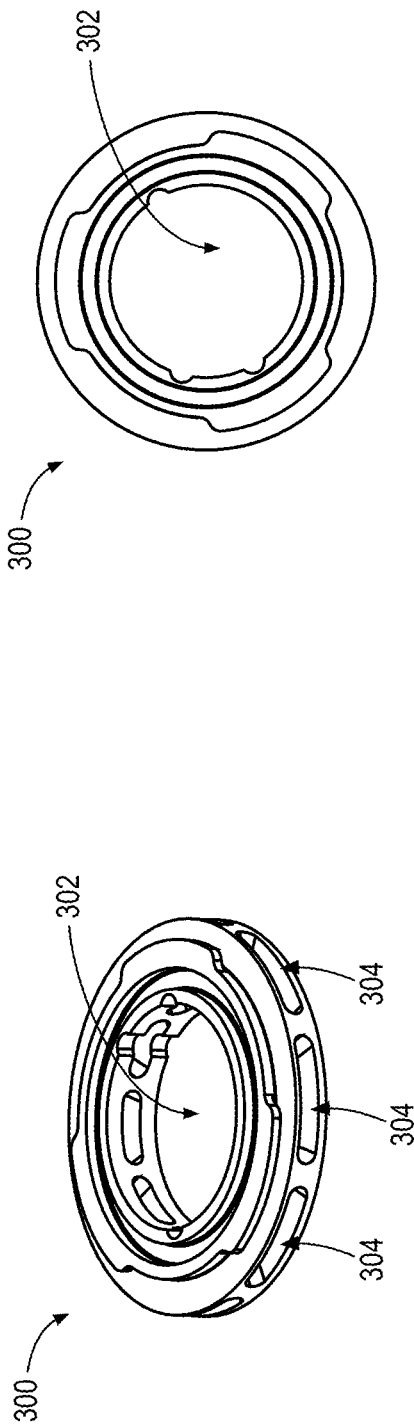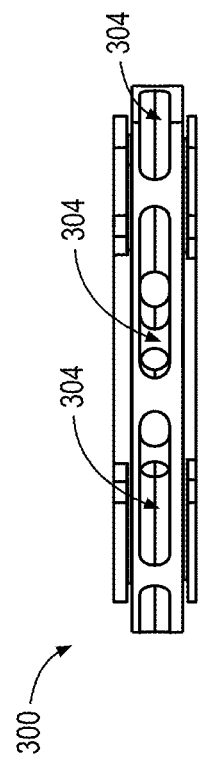
FIG. 12A
FIG. 12B
FIG. 12C

HEAT EXCHANGERS CAPABLE OF BIDIRECTIONAL FLUID FLOW

FIELD OF THE INVENTION

The present invention generally relates to heat exchangers, and more specifically to low-profile heat exchangers capable of accommodating a bidirectional fluid flow for effectively dissipating heat from and transmitting heat to objects requiring temperature control or regulation in either direction of flow, for controlling the temperature of batteries, including battery systems for electric vehicles.

BACKGROUND OF THE INVENTION

The performance of various kinds of devices—such as transistors, circuit components, integrated circuits, and batteries—often directly correlates with temperature. In general, an increase in temperature causes an increase in impedance in conductors and semiconductors which, in turn, can lead to an even greater production of heat. This heat-impedance feedback loop is well known. To reduce or maintain a level of heat, devices that produce heat are commonly cooled by heat sinks, fans, or liquid cooling apparatuses. Some systems include temperature probes that monitor for overheating and, if detected, intentionally throttle down performance or shut down the device entirely to prevent permanent damage.

Likewise, the performance and product lifetime of some batteries can be affected by the temperatures generated by those batteries—both in the short-term and long-term. Many batteries discharge stored energy through electrochemical reactions, the rate of which depends, in part, upon the temperature of the electrodes and electrolyte of the battery, according to the well-known Arrhenius equation. Additionally, excessive heat can cause a degradation in the electrolytes of many types of rechargeable batteries, thereby reducing a battery's life span and maximum charge capacity. Like semiconductor devices, batteries can also experience heat runaway if the temperature of the battery exceeds a catalyst temperature, which can lead to fire or explosion. Conversely, at lower temperatures batteries function sub-optimally, such that increasing their temperature would result in improved performance.

Thermal gradients across a battery cell can also have a negative impact on a battery's performance and longevity. For instance, an intra-cell temperature gradient can affect the diffusion and charge transfer reaction process in rechargeable batteries, such as in lithium ion batteries. Additionally, differences in temperature across a single battery cell can result in an increase in battery impedance, which in turn may lead to the production of more heat as energy is dissipated through that impedance.

In some applications, multiple batteries or battery cells are electrically connected to each other in series or parallel. Temperature differences between batteries or battery cells within a pack can also reduce the performance of the entire pack—even if the temperatures in each battery or cell are within a nominal operating temperature range. In systems that rely heavily on battery pack performance (e.g., electric vehicles), it is desirable to have a battery pack that can withstand rapid charging and discharging. However, temperature differences across batteries or battery cells in a pack, even by a few degrees Celsius, might render the performance of the entire pack inadequate for some applications.

The known effects of high temperatures, temperature gradients, and temperature differences within electronic devices, and across battery cells, has led to the development of cooling and heat management systems for such devices and batteries. Passive cooling mechanisms, such as heat sinks, are typically insufficient for high performance applications. Active cooling mechanisms that utilize forced air cooling (e.g., fans) or circulated liquid cooling are more common in systems that generate substantial amounts of heat, or are otherwise crippled by overheating. Often, passive components such as heat sinks and thermal paste are coupled with active cooling elements in thermal management systems, in order to achieve a greater amount of cooling.

A traditional liquid-cooling thermal management system includes a thermally-conductive element in direct or proximate contact with the object to be cooled (e.g., a metal plate or heat sink), which draws heat from the object. That thermally-conductive element is in thermal contact with a coolant, either directly (e.g., as the outer surface of a liquid coolant conduit) or indirectly (e.g., in contact with a separate liquid coolant conduit), thereby drawing heat from the thermally-conductive element. The warmed/cooled liquid coolant then flows to a heat exchanger or a heater, such as a radiator or electrical heater, which regulates the temperature of the liquid coolant before recirculating the liquid coolant back toward the thermally-conductive element.

Traditional liquid temperature control systems, which are often more effective at transferring heat from/to an object compared to air-cooled systems, may not adequately address the above-described issues arising from temperature gradients within battery cells and temperature differentials across battery cells. For instance, the level of cooling in traditional liquid cooling systems is often not uniform across a given surface area. As liquid coolant flows from an inlet toward an outlet, it accumulates heat, thereby rendering the liquid near the coolant outlet warmer than liquid near the inlet. This temperature gradient in the liquid coolant itself can result in a corresponding temperature gradient across the object being cooled. The liquid coolant temperature gradient can also lead to a temperature differential between two objects being cooled by the same system. Such uneven cooling can substantially reduce the performance of a battery pack, can reduce the longevity of the battery pack, and in some cases can be dangerous as localized impedances and degradations build up in the battery cells over time.

One known technique for reducing the severity of temperature gradients across a surface of a circulated coolant-type heat exchanger involves providing a set of channels in a counter-flow or "countercurrent" arrangement. In a counter-flow heat exchanger, a set of "cold" fluid channels, with fluid flowing in one direction, are interlaced with and in thermal connection with a set of "warm" fluid channels with fluid flowing in the opposite direction. The "cold" fluid channels may receive liquid coolant supplied from an inlet, whereas the "warm" fluid channels may receive liquid coolant supplied (or recirculated) from the "cold" channels. In such an arrangement, alternating the "hot" and "cold" channels serves to reduce temperature gradients along the coolant flow direction (from a manifold side to a recirculation side of the heat exchanger).

While counter-flow channel designs can mitigate temperature gradients, the temperature gradients across a typical counter-flow heat exchanger may still be too large for some applications. It is therefore an object of the present invention to provide heat exchangers capable of providing both effective and substantially uniform cooling across its heat-exchanging surface area.

In addition, it is often desirable to provide a low-profile battery pack that can fit into smaller spaces. In electric vehicles, for example, battery packs are commonly located beneath the passenger cabin—rather than in the trunk or under the hood—in order to improve the safety and handling of the vehicle. One goal of battery pack design may be, therefore, to minimize the size of the thermal management system along one or more dimensions to thereby provide the maximum amount of space for the batteries—all within a relatively small assembly. It is therefore another object of the present invention to provide heat exchangers that are capable of providing substantially uniform cooling, while simultaneously being shallow, thin, low-profile, or otherwise limited in size along at least one axis of dimension.

In some applications, multiple countercurrent-type heat exchangers may be arranged in a compact configuration (e.g., so as to fit within an assembly or enclosure). Depending on the particular arrangement, some heat exchangers may be oriented differently from other heat exchangers, to accommodate other structural elements, reduce the total amount of space taken up by the heat exchangers, and/or for other various reasons. One solution to this problem may involve the construction of similar, but distinct, heat exchanger designs corresponding to each respective orientation. However, providing multiple heat exchanger designs may substantially increase the cost of development, testing, and manufacturing the multi-heat exchanger arrangement. It is therefore another objective of the present application to provide heat exchangers that are modular, of a like component construction that is repositionable and reorientable, and also capable of bidirectional fluid flow with equivalent heat dissipating characteristics in either direction, while maintaining a suitable amount of cooling, regardless of the direction of coolant flow through the heat exchanger. In these embodiments of the invention, a pair of ports can interchangeably serve as a coolant inlet and a coolant outlet for the heat exchanger. Coolant may flow in the direction from one port to the other, or in the reverse direction, with both coolant flow directions providing substantially the same temperature regulation effectiveness.

These and other objectives and advantages of the present invention will become apparent from the following detailed written description, drawing figures, and claims.

SUMMARY OF THE INVENTION

To accomplish the aforementioned objectives, embodiments of the present invention provide for heat exchangers that significantly improve upon existing counter-flow heat exchangers by incorporating one or more fluid distribution features that increase the temperature uniformity across the cooling regions of the heat exchangers. In example embodiments, a heat exchanger includes a cooling "block" formed from a stack of three plates—a top plate, a middle plate, and a bottom plate. The top plate and/or the bottom plate includes one or more cooling surfaces, such as flat regions against which objects are in thermal connection (either directly, or indirectly via passive elements such as attached metal fins or heat sinks).

The middle plate includes a series of elongated corrugations that, when situated between the top and bottom plates, forms two sets of sealed, coolant-flow channels: namely a first set of channels formed in the space between the corrugations and the top plate, and a second set of channels formed in the space between the corrugations and the bottom plate, both of which extend substantially across the width of the cooling block. The top plate has formed therein a top coolant manifold, in fluid connection with a first coolant port, through which coolant can flow into and out of the top coolant manifold. The top coolant manifold is adapted to convey coolant to or from the first set of channels by way of a first plurality of coolant apertures. Similarly, the bottom plate has formed therein a bottom coolant manifold, which is adapted to convey coolant to or from the second set of channels via a second plurality of coolant apertures. The bottom coolant manifold is also fluidly coupled to a second coolant port, through which the bottom coolant manifold can receive coolant or direct coolant.

In some embodiments of the present invention, the first and second sets of channels are "interlaced," such that each channel from the first set (other than the channels at the respective ends of the heat exchanger) is directly adjacent to a pair of channels from the second set, and vice versa. At the side of the block, opposite the top and bottom manifolds, one or more recirculation apertures is provided in the middle plate, which allows coolant to flow between the first set of channels and the second set of channels. During an example cooling operation, the first set of channels have flowing therethrough lower temperature coolant, compared to the second set of channels, as the coolant flowing through the second set of channels has already drawn heat from the electrical components or batteries as it flowed through the first set of channels, or vice versa. Interlacing the first and second sets of channels, therefore, results in more efficient temperature uniformity—at least along the axes parallel to the coolant flow channels.

However, temperature uniformity in yet other dimensions is also desirable. While the above-described counter-flow channel arrangement may reduce temperature variation along the coolant channels, such an arrangement may still have substantial temperature gradients across the coolant channels. Depending on the arrangement of the object or objects to be cooled, a temperature gradient across coolant channels may degrade performance, reduce longevity, and/or lead to dangerous operating conditions.

One of the contributing factors leading to uneven cooling across cooling channels is the net volume of coolant flowing through each channel over a given period of time. For instance, if one coolant channel has twice as much coolant flowing through it per minute compared to another coolant channel, the coolant channel with a higher volume of coolant flow will effect a greater amount of cooling in the region proximate that channel, compared to the other coolant channel. The amount of fluid flow through a given region, channel, or portion of a heat exchanger may be proportionate with one or more of the fluid pressure and/or fluid velocity. Accordingly, differences in fluid pressure and/or fluid velocity across coolant channels may also lead to temperature gradients across those channels.

While the coolant flow rate through a given channel is proportionate to the extent of temperature regulation achieved near that channel, it may not necessarily be desirable to develop a heat exchanger that generates equal flow rates through each of the channels. As coolant flows into and travels along a manifold of the heat exchanger, its temperature may be raised or lowered due to thermal influences of objects being heated or cooled by the heat exchanger, and/or by the temperature of coolant collected in the opposite manifold. As a result, the temperature of coolant distributed into coolant channels proximate to the inlet may be different from the temperature of coolant distributed into channels near the opposite end of the heat exchanger. In such instances, the provision of equal flow rates across all coolant channels could lead to larger temperature gradients across the heat exchanger than might otherwise be achieved by the provision of varied flow rates across the coolant channels.

To allay this problem, heat exchangers according to the present application may incorporate one or more fluid velocity, pressure, and/or volume distribution features which, during operation, lead to more uniform temperatures across the coolant channels. In some examples, a heat exchanger manifold may be configured to distribute a lesser amount of coolant (e.g., a lower coolant flow rate) to channels nearer to a coolant inlet, and a comparatively greater amount of coolant (e.g., a higher coolant flow rate) to channels near the end opposite to the coolant inlet. Similar manifold configurations may be mirrored across both the top and bottom manifolds, to enable the heat exchanger to generate the beneficial coolant distribution for reducing temperature gradients, regardless of the direction of coolant flow.

In an example embodiment, a heat exchanger may include a first plurality of coolant apertures, which fluidly connects a top coolant manifold with a first set of coolant channels. During a forward flow operation, coolant flows through a first coolant port and into the top coolant manifold. A portion of that coolant may be directed through coolant apertures proximate to the first coolant port, thereby leading to a decrease in fluid velocity. Because fluid velocity decreases from the first coolant port toward the opposite end of the top coolant manifold, the distances between adjacent coolant apertures may be larger near the first coolant port compared to the distances between adjacent coolant apertures far from the first coolant port. By providing a higher "density" of coolant apertures in portions of the top coolant manifold, where fluid velocity/pressure differential could be relatively low, the distribution of coolant may be more evenly balanced—at least with respect to a heat exchanger in which the spacing between coolant apertures is uniform along an entire manifold.

In this embodiment, the heat exchanger may also include a second plurality of coolant apertures, which fluidly connects a bottom coolant manifold to a second set of coolant channels. During a reverse flow operation—in which coolant flows in the opposite direction through the heat exchanger as in the previously-described example—a coolant flows through a second coolant port and into the bottom coolant manifold. A portion of that coolant may be directed through coolant apertures proximate to the second coolant port, thereby resulting in a decrease in fluid velocity. Because fluid velocity decreases from the second coolant port toward the opposite end of the bottom coolant manifold, the distances between adjacent coolant apertures may be larger near the second coolant port compared to the distances between adjacent coolant apertures far from the second coolant port. The effect of this configuration may be to more balance the distribution of coolant across the second set of coolant channels in a way that leads to a greater temperature uniformity across the entire heat exchanger.

Some combination of coolant aperture positioning, spacing, and geometry, together with the shape of the top and bottom coolant manifolds, may collectively contribute to an increase in temperature uniformity across the entire heat exchanger-regardless of whether coolant flows in a "forward" direction, or a "reverse" direction. In other words, heat exchangers described herein may be capable of bidirectional fluid flow. Accordingly, the heat exchangers of the present disclosure may be described as "modular," in that the same cooling block design may be used in multiple orientations, while still providing substantially similar temperature regulation. Advantageously, the bidirectional flow capabilities of the present heat exchangers may reduce the number of distinct components involved in the construction of a multi-heat exchanger assembly, and allow the same components (e.g., plates, sealing blocks, etc.) to be reused for each cooling block in the assembly.

In a forward flow operation, the first coolant port may be considered a coolant inlet, the top coolant manifold may be considered an inlet distribution manifold, the first plurality of coolant apertures may be considered inlet distribution apertures, the first set of coolant channels may be considered "feed" channels. In addition, during a forward flow operation, the second coolant port may be considered a coolant outlet, the bottom coolant manifold may be considered an outlet collection manifold, the second plurality of coolant apertures may be considered outlet collection apertures, the second set of coolant channels may be considered "return" channels.

However, in a reverse flow operation, the nomenclature may be reversed, such that the first coolant port may be considered a coolant outlet, the top coolant manifold may be considered an outlet collection manifold, the first plurality of coolant apertures may be considered outlet collection apertures, the first set of coolant channels may be considered "return" channels. Likewise, during a reverse flow operation, the second coolant port may be considered a coolant inlet, the bottom coolant manifold may be considered an inlet distribution manifold, the second plurality of coolant apertures may be considered inlet distribution apertures, the second set of coolant channels may be considered "feed" channels. Accordingly, it should be understood that any reference to an "inlet," "outlet," "distribution," "collection," "feed," "return," or any other flow-specific label is provided merely within the context of a particular operation or example, and does not limit the scope of the described embodiment to a particular direction of coolant flow.

In some instances, fluid velocities near the coolant port serving as the coolant inlet may be substantial, such that coolant may flow past the first few coolant apertures proximate the coolant inlet, leading to an undesirable distribution of coolant. Embodiments described herein include coolant manifolds that integrate one or more fluid balancing features which encourage a more beneficial distribution of coolant, which may be biased in a manner that leads to a reduction in temperature gradients across the heat exchanger during operation. For example, a coolant manifold may have integrally formed therein one or more support portions, or "dimples," which increase the structural integrity of the coolant manifold, while also increasing the turbulence and reducing the velocity of the coolant flowing therethrough—which may, in turn, lead to a more beneficial coolant distribution. In combination, the fluid balancing features integrated within the heat exchanger may mitigate undesirable fluid dynamics and lead to a greater temperature uniformity across the heat exchanger during operation.

Some heat exchangers according to the present application may also include multiple "matrixes"—or sections of the heat exchanger corresponding to distinct cooling surfaces adjacent to a subset of the cooling channels. In these embodiments, the fluid connections between adjacent matrixes may be restricted, to generate coolant flow rates through the coolant channels associated with each respective matrix that promotes substantial temperature uniformity across the coolant channels and matrixes. For applications that demand substantial cooling, such as the cooling of batteries powering electric vehicles, coolant may flow through the coolant manifolds at high velocities. In these circumstances, an example heat exchanger with multiple matrixes may include "transition" channels within the coolant manifolds, which may also create backpressures during operation, to encourage coolant to flow more evenly into each of the matrixes.

In some heat exchanger arrangements, one or more coolant apertures may receive comparatively less coolant than other coolant apertures, due to the fluid dynamics within a coolant manifold. For instance, the first coolant aperture of a given matrix (e.g., adjacent to a transition channel, at or near an end of the manifold, etc.) may receive an insufficient amount of coolant during operation. To further modulate the coolant distribution—and, in turn, influence temperature gradients across the heat exchanger—one or more coolant apertures may be oriented, curved, angled, or otherwise shaped in a way that increases or decreases the coolant flow rate through those one or more apertures. For example, a coolant aperture positioned near an end of a manifold opposite to the coolant port may be angled, tapered, or curved to compensate for low fluid pressure and/or velocity near that aperture.

Other aspects of a heat exchanger's structure and arrangement may be varied to further adjust fluid pressures, velocities, and flow rates during operation in a way that reduces the magnitude of temperature gradients across the heat exchanger. For example, obstructions—such as the "dimples" described above and shown herein—may be intentionally integrated with a coolant manifold to increase the turbulence within the manifold, among other things. The shape of a coolant manifold may also be adjusted to mitigate against portions in which fluid velocities are abnormally low or high. As a specific example, the end of the coolant manifold opposite the coolant port directly coupled thereto may be tapered or curved, to encourage coolant that collides with that end of the manifold to flow toward one or more of the nearby coolant apertures. Other flow distribution features are also possible.

As described herein, "balancing" fluid distribution to create a more "even" distribution of coolant may not necessarily refer to a distribution of a volume of fluid over time that is even through the heat exchanger, but may instead be somewhat biased toward a particular distribution of coolant during operation. In some cases, heat-emitting objects in thermal contact with the heat exchanger may raise the temperature of coolant as it flows through a coolant manifold, prior to its distribution into coolant channels via coolant apertures. In such cases, an even distribution of coolant may lead to a temperature gradient in which the temperature across the heat exchanger increases moving away from the coolant port serving as the coolant inlet. To promote a greater temperature uniformity, some heat exchangers of the present application may be configured to distribute a lesser amount of coolant in regions of the heat exchanger that are nearest to the operational coolant inlet, and a comparatively greater amount of coolant in regions of the heat exchanger that are further from the operational coolant inlet. During operation, the regions of the heat exchanger that have flowing therethrough coolant that has already been warmed also have higher coolant velocities, pressures, and/or volume flowing therethrough over time. In other words, the differences in coolant temperature entering coolant flow channels across the heat exchanger are counterbalanced by corresponding differences in coolant distribution, to thereby promote a more substantial temperature uniformity across the heat exchanger.

While various example flow balancing features are described above and in greater detail below, it should be understood that the particular dimensions, shapes, and features used in a specific implementation may depend on the fluid dynamics of that specific implementation. The specific examples shown and described herein are provided for explanatory purposes. Different combinations of flow balancing elements may be present in various implementations. The present application is not limited to the explicitly provided examples.

According to a first aspect of the present invention, there is provided a heat exchanger for cooling objects, using recirculated coolant, which is capable of bidirectional coolant flow between a first coolant port and a second coolant port. The heat exchanger includes a top plate, a bottom plate, and a middle plate operably situated between the top and bottom plates. The top, middle, and bottom plates are sealedly engaged for circulation of the coolant, and collectively form a "stacked" cooling block having a first end and a second end substantially opposite the first end, and a manifold side and a recirculation side substantially opposite the manifold side. The manifold side and recirculation side are operably positioned between the first and second ends, respectively. The first coolant port is adapted to convey coolant into or from coolant passageways formed between the top and middle plates. Likewise, the second coolant port is adapted to convey coolant into or from coolant passageways formed between the middle and bottom plates.

The heat exchanger also includes a plurality of coolant flow channels extending substantially between the manifold and recirculation sides. The plurality of coolant flow channels include a first set of coolant channels, which are formed between the top and middle plates, and a second set of coolant channels, which are formed between the bottom and middle plates. The first and second sets of coolant channels are fluidly connected through one or more recirculation apertures formed in the middle plate proximate to the recirculation side. In addition, the heat exchanger includes a top coolant manifold formed between the top and middle plates proximate to the manifold side, and extending substantially between the first and second ends. The top coolant manifold is adapted to convey coolant through the first coolant port positioned proximate to the first end, and to direct coolant to and from said first set of coolant channels via a first plurality of coolant apertures positioned therebetween.

The heat exchanger further includes a bottom coolant manifold formed between the bottom and middle plates proximate to the manifold side and extending substantially between the first and second ends. The bottom coolant manifold is adapted to direct coolant to and from the second set of coolant channels and the bottom coolant manifold via a second plurality of coolant apertures positioned therebetween, and to convey coolant through the second coolant port positioned proximate to the second end. The bottom coolant manifold is also in substantial stacked alignment with the top coolant manifold (e.g., along the z-axis, as defined in FIGS. 1-14B of the present application).

In the embodiments according to the first aspect, the first coolant port is operably interchangeable with the second coolant port, without materially affecting the temperature regulation effects of the heat exchanger. A forward flow direction is defined by the first coolant port serving as a coolant inlet and the second coolant port serving as the coolant outlet. Conversely, a reverse flow direction is defined by the second coolant port serving as the coolant inlet and the first coolant port serving as the coolant outlet, which results in substantially the same coolant cooling effectiveness as that of the forward flow direction.

In some embodiments according to the first aspect, the heat exchanger is configured for positioning with and fluid coupling to a coolant source and a coolant drain, such that the heat exchanger can be oriented in either (i) a first orientation in which the first coolant port is coupled to the coolant source and the second coolant port is coupled to the coolant drain, or (ii) a second orientation in which the first coolant port is coupled to the coolant drain and the second coolant port is coupled to the coolant source, without materially affecting the temperature regulation effects of the heat exchanger.

In some embodiments according to the first aspect, the top coolant manifold is configured to circulate coolant into the first set of coolant channels in accordance with a first coolant distribution that promotes a substantially uniform temperature (e.g., a suitable temperature gradient) across the heat exchanger when the heat exchanger directs coolant in the forward direction. The first coolant distribution (e.g., flow rates, coolant volume per unit time, pressures, etc.) may be substantially even, or biased in a particular manner that compensates for differences in the temperature of coolant flowing into the coolant flow channels.

For example, the first coolant distribution may include (i) a first coolant flow rate through a first coolant channel proximate to the first end, and (ii) a second coolant flow rate through a second coolant channel proximate to the second end. The second coolant flow rate may be greater than the first coolant flow rate, to compensate for potentially higher coolant temperatures being directed through the second coolant channel relative to the coolant temperature being directed through the first coolant channel.

In some embodiments according to the first aspect, the bottom coolant manifold is configured to circulate coolant into the second set of coolant channels in accordance with a second coolant distribution that promotes a substantially uniform temperature across the heat exchanger when the heat exchanger directs coolant in the reverse direction. The second coolant distribution (e.g., flow rates, coolant volume per unit time, pressures, etc.) may be substantially even, or biased in a particular manner that compensates for differences in the temperature of coolant flowing into the coolant flow channels.

For example, the second coolant distribution may include (i) a first coolant flow rate through a first coolant channel proximate to the second end and (ii) a second coolant flow rate through a second coolant channel proximate to the first end, wherein the second coolant flow rate is greater than the first coolant flow rate, to compensate for potentially higher coolant temperatures being directed through the second coolant channel relative to the coolant temperature being directed through the first coolant channel.

In some embodiments according to the first aspect, the first plurality of coolant apertures includes at least (i) a first pair of coolant apertures having a first distance extending therebetween, and (ii) a second pair of coolant apertures having a second distance extending therebetween that is smaller than the first distance. The first pair of coolant apertures may be positioned nearer to the first coolant port than the second pair of coolant apertures, to distribute coolant through the first and second pairs of coolant apertures in a manner that promotes a substantially uniform temperature across the heat exchanger.

In these embodiments, the cooling block includes a first matrix having a first series of the plurality of coolant flow channels, a first section of said top coolant manifold, and a first series of said first plurality of coolant apertures. The cooling block also includes a second matrix comprising a second series of the plurality of coolant flow channels, a second section of said top coolant manifold, and a second series of said first plurality of coolant apertures. The first matrix may be positioned nearer to the first coolant port than the second matrix. Additionally, the first and second sections of the top coolant manifold may be fluidly connected, to distribute coolant into both of the first and second series of the plurality of coolant flow channels, respectively.

In these embodiments, the first coolant distribution includes (i) a first coolant volume per unit time distributed into the first series of the plurality of coolant flow channels corresponding to the first matrix, and (ii) a second coolant volume per unit time distributed into the second series of the plurality of coolant flow channels corresponding to the second matrix. The second coolant volume per unit time may be greater than the first coolant volume per unit time, to maintain substantially uniform temperatures across the heat exchanger.

In these embodiments, the first series of first plurality of coolant apertures of the first matrix includes at least (i) a first pair of first plurality of coolant apertures having a first distance extending therebetween, and (ii) a second pair of first plurality of coolant apertures having a second distance extending therebetween that is smaller than the first distance. The first pair of first plurality of coolant apertures is positioned nearer to the first coolant port than the second pair of first plurality of coolant apertures to distribute coolant through at least the first and second pairs of first plurality of coolant apertures, to promote a substantially uniform temperature across the heat exchanger.

In some embodiments, the top coolant manifold also includes one or more transition channels extending substantially between the first section of the top coolant manifold and the second section of the top coolant manifold. The one or more transition channels restrict coolant fluid flow between the first and second sections of the top coolant manifold, such that coolant entering the top coolant manifold through the first coolant port is distributed between the first and second sections of the top coolant manifold in a manner that promotes a substantially uniform temperature across the heat exchanger. In some instances, more coolant is distributed to the second section of the top coolant manifold than the first section of the top coolant manifold when coolant flows in a forward direction from the first coolant port and into the top coolant manifold. In other instances, more coolant is distributed to the first section of the top coolant manifold than the second section of the top coolant manifold when coolant flows in a reverse direction from the top coolant manifold and through the first coolant port.

In some cases, the second series of first plurality of coolant apertures of the second matrix may include at least one aperture that is proximate to the second end and is angled relative to the other coolant apertures of the second series of coolant apertures, to distribute coolant across each aperture of the second series of first plurality of coolant apertures to promote a substantially uniform temperature across the heat exchanger.

In addition to the first and second matrixes, some embodiments provide a cooling block that also includes a third matrix. The third matrix includes a third series of the plurality of coolant flow channels, a third section of the top coolant manifold, and a third series of the first plurality of coolant apertures. In these embodiments, the third matrix may be positioned further from the first coolant port than the second matrix, and wherein the second and third sections of the top coolant manifold are fluidly connected, such that the top coolant manifold distributes coolant into the first, second, and third series of the plurality of coolant flow channels.

In such three-matrix embodiments, the first coolant distribution may include (i) a first coolant volume per unit time distributed into the first series of the plurality of coolant flow channels corresponding to the first matrix, (ii) a second coolant volume per unit time distributed into the second series of the plurality of coolant flow channels corresponding to the second matrix, and (iii) a third coolant volume per unit time distributed into the third series of the plurality of coolant flow channels corresponding to the second matrix. The third coolant volume per unit time may be greater than the second volume per unit time, and the second coolant volume per unit time may be greater than the first coolant volume per unit time.

In some cases, the one or more transition channels may be one or more first transition channels. In these cases, the top coolant manifold may also include one or more second transition channels extending substantially between the second section of the top coolant manifold and the third section of the top coolant manifold. The one or more second transition channels restrict coolant fluid flow between the second and third sections of the top coolant manifold, such that coolant entering the top coolant manifold through the first coolant port is distributed among the first, second, and third sections of the top coolant manifold to promote a substantially uniform temperature across the heat exchanger.

In some embodiments according to the first aspect, the heat exchanger also includes a first coolant rail in fluid connection with the first coolant port and adapted to direct coolant through and from the first coolant port and into and from the top coolant manifold.

In some embodiments according to the first aspect, the heat exchanger also includes a second coolant rail in fluid connection with the second coolant port and adapted to receive coolant through the second coolant port from the bottom coolant manifold.

In some embodiments according to the first aspect, the heat exchanger also includes a plurality of cooling fins in contact with and extending from the top plate, the plurality of cooling fins adapted to exchange heat with objects in contact therewith to, in turn, exchange heat with coolant flowing through the plurality of coolant flow channels.

In some embodiments according to the first aspect, the heat exchanger also includes one or more support portions integrally formed within the top coolant manifold.

In some embodiments, the first coolant port includes an annular sealing block adapted to convey coolant between the top coolant manifold and a coolant inlet rail. Additionally, the second coolant port may include an annular sealing block adapted to convey coolant between the bottom coolant manifold and a coolant outlet rail.

According to a second aspect of the present invention, there is provided a thermal management assembly for regulating the temperature of objects using a coolant, using recirculated coolant, which includes a first heat exchanger, a second heat exchanger, a coolant inlet rail, and a coolant outlet rail. The first and second heat exchangers have the same component construction, as described above with respect to the first aspect. The coolant inlet rail is configured to direct coolant into the first and second heat exchangers, while the coolant outlet rail is configured to receive coolant from the first and second heat exchangers. With respect to the first heat exchanger, the first coolant port is fluidly coupled to the coolant inlet rail, and the second coolant port is fluidly coupled to the coolant outlet rail. With respect to the second heat exchanger, the first coolant port is fluidly coupled to the coolant outlet rail, and the second coolant port is fluidly coupled to the coolant inlet rail. Accordingly, the first and second heat exchangers are oppositely oriented, such that the inlet-side manifold of the first heat exchanger is its top manifold, while the inlet-side manifold of the second heat exchanger is its bottom manifold.

The foregoing summary is illustrative only and is not intended to be in any way limiting. In addition to the illustrative aspects, embodiments, and features described above, further aspects, embodiments and features will become apparent by reference to the drawing figures, the following detailed description, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a better understanding of the invention, and to show how the same may be implemented, there will now be described by way of example only, specific embodiments, methods and processes according to the present invention with reference to the accompanying drawings in which:

FIG. 5D is a detailed top plan view of a matrix of the top plate of the example cooling block, according to the embodiment of FIG. 5A;

FIG. 12A is a perspective view of an example sealing block, according to the embodiment of FIG. 1;

FIG. 12B is a top plan view of the example sealing block, according to the embodiment of FIG. 12A;

FIG. 12C is an elevated side view of the example sealing block, according to the embodiment of FIG. 12A;

DETAILED DESCRIPTION OF THE EMBODIMENTS

There will now be described by way of example, several specific modes of the invention as contemplated by the inventor. In the following description, numerous specific details are set forth in order to provide a thorough understanding. It will be apparent however, to one skilled in the art, that the present invention may be practiced without limitation to these specific details. In other instances, well known methods and structures have not been described in detail so as not to unnecessarily obscure the description of the invention.

As described above, the performance of some systems, such as high performance battery packs for electric vehicles, depends on the extent to which its thermal management system can provide cooling that is both sufficient and substantially uniform. For example, high performance rechargeable battery packs may include a large number of battery cells, some electrically connected in series (e.g., to provide adequate voltage) and others electrically connected in parallel (e.g., to increase current input and output). Temperature variations within individual cells, as well as across cells, may hinder the battery system's ability to rapidly charge and discharge.

Embodiments of the present invention provide low-profile, flow-balanced heat exchangers for integration with thermal management systems capable of maintaining substantially uniform temperatures across its cooling surfaces. An example thermal management system includes a coolant inlet rail, a coolant outlet rail, and a plurality of cooling "blocks" fluidly coupled therebetween by way of respective coolant inlet and outlet ports. Each cooling block includes one or more flow balancing features integrated within the top and bottom manifolds that distribute coolant so as to maintain substantially even temperatures throughout the entire block.

Figure 13:
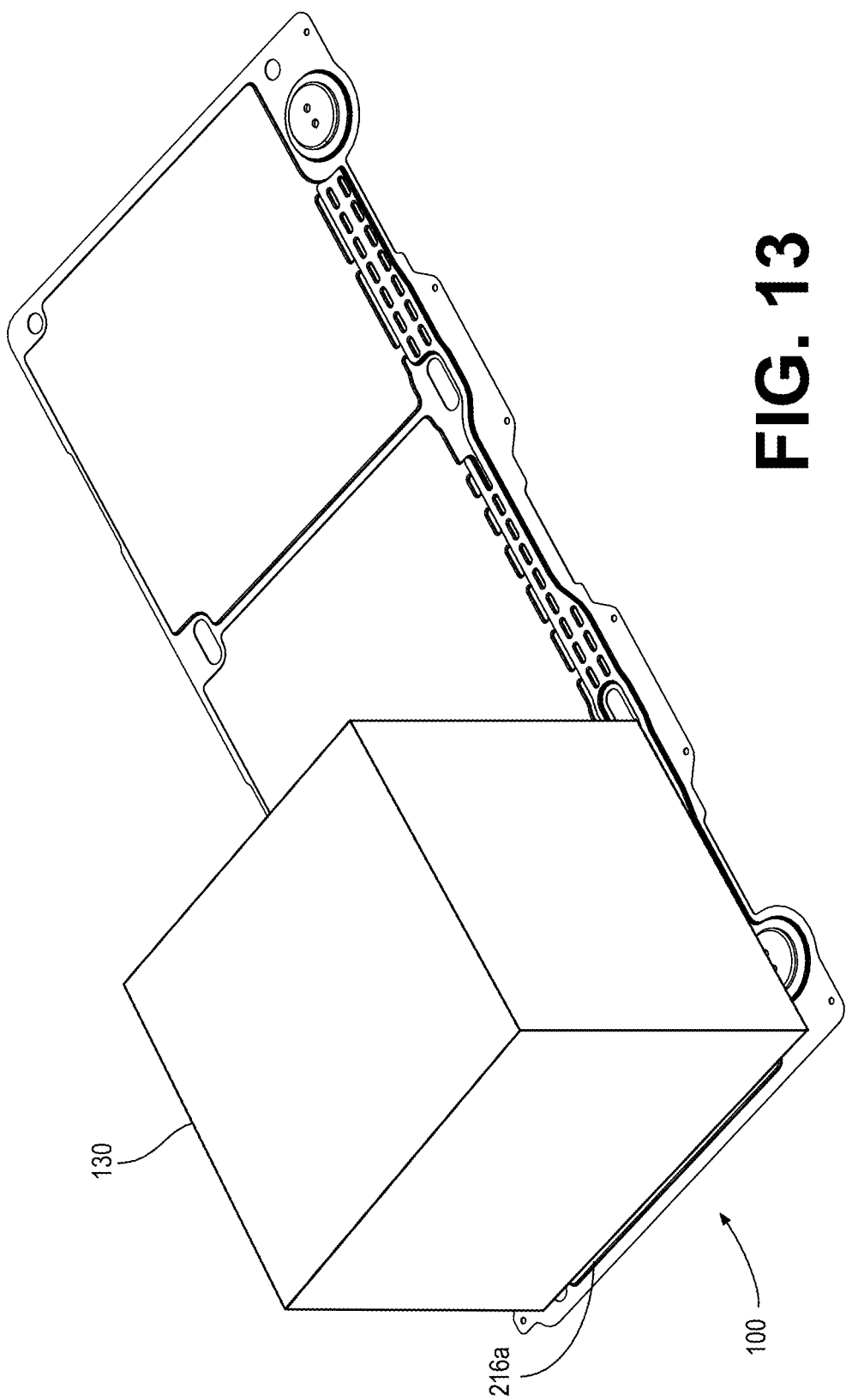
FIG. 13 is a perspective view illustrating an example arrangement of a battery pack on a cooling block of the subject heat exchanger assembly, according to the embodiment of FIG. 1.

In an example implementation, each cooling block may have coupled thereto a set of metal "fins" or heat sinks, which protrude outwardly from its cooling surface or surfaces. As shown in FIG. 13, a battery pack may be positioned against the cooling block, which generates heat or is heated during operation. Heat from the battery cells is transferred to the cooling surface or surfaces of the block. Coolant flowing through the cooling blocks draws the heat from the cooling surface or surfaces, which is directed through a coolant port serving as a coolant outlet and into the outlet rail. A separate system (e.g., a radiator) may be used to reduce the temperature of the coolant, which is then continuously supplied back into the thermal management system through a pipe connected to the coolant inlet rail.

Various aspects of a cooling block—including the sizes, shapes, and arrangement of manifolds, apertures, and channels through which coolant flows—may be specifically tuned, in order to generate a fluid distribution throughout the cooling block's coolant flow paths that promotes a substantially uniform temperature across the cooling block. In multi-block systems, aspects of the coolant inlet and outlet ports may also be tuned to provide a particular fluid distribution (or to at least mitigate otherwise uneven fluid distribution) across each cooling block to promote a more uniform temperature gradient during operation. The following description, with respect to FIGS. 1-14B, illustrates an example heat exchanger assembly with structural elements that, in combination, distribute coolant in a manner leading to substantially uniform heating and/or cooling throughout the cooling blocks, during operation.

As described herein, "coolant" may refer to any fluid—including gas, liquid, or some combination thereof—serving as a medium that draws heat from cooling blocks to cool or otherwise thermally modulate an object or objects. Although a "coolant" may be described herein as a liquid, the present application is not limited to liquid coolants. Any recitation of "liquid coolant" should be understood to encompass coolants that may not necessarily be in a liquid state.

As described herein, fluid "distribution" may refer to the extent to which a total amount of fluid circulates through various flow paths of a heat exchanger over a given period of time. Fluid distribution may be described as "uneven" where fluid along one flow path has a greater flux (e.g., volume per unit time), flow rate (e.g., velocity), and/or pressure relative to that of fluid along a different flow path. In contrast, fluid distribution may be described as "even" with respect to two or more flow paths when the fluid flux, flow rate, and/or pressure is the same, substantially the same, or differs by only an acceptable amount.

The following description of FIGS. 1-14B may include orientation terminology such as "top," "bottom," "inlet end," and "outlet end," among other terms. These terms are described with respect to axes provided in each of the drawings, and may be alternated as desired. In addition, each flow-specific term, such as "inlet" and "outlet," may refer to a port, aperture, channel, or other element directing fluid in a particular direction during a particular operation. However, the heat exchangers described herein are capable of bidirectional fluid flow while still providing suitable temperature management. Thus, any direction-specific designation should be understood to pertain to a specific example, and that a particular element may convey coolant in either direction, depending on its orientation and arrangement in a particular system.

Figure 1:
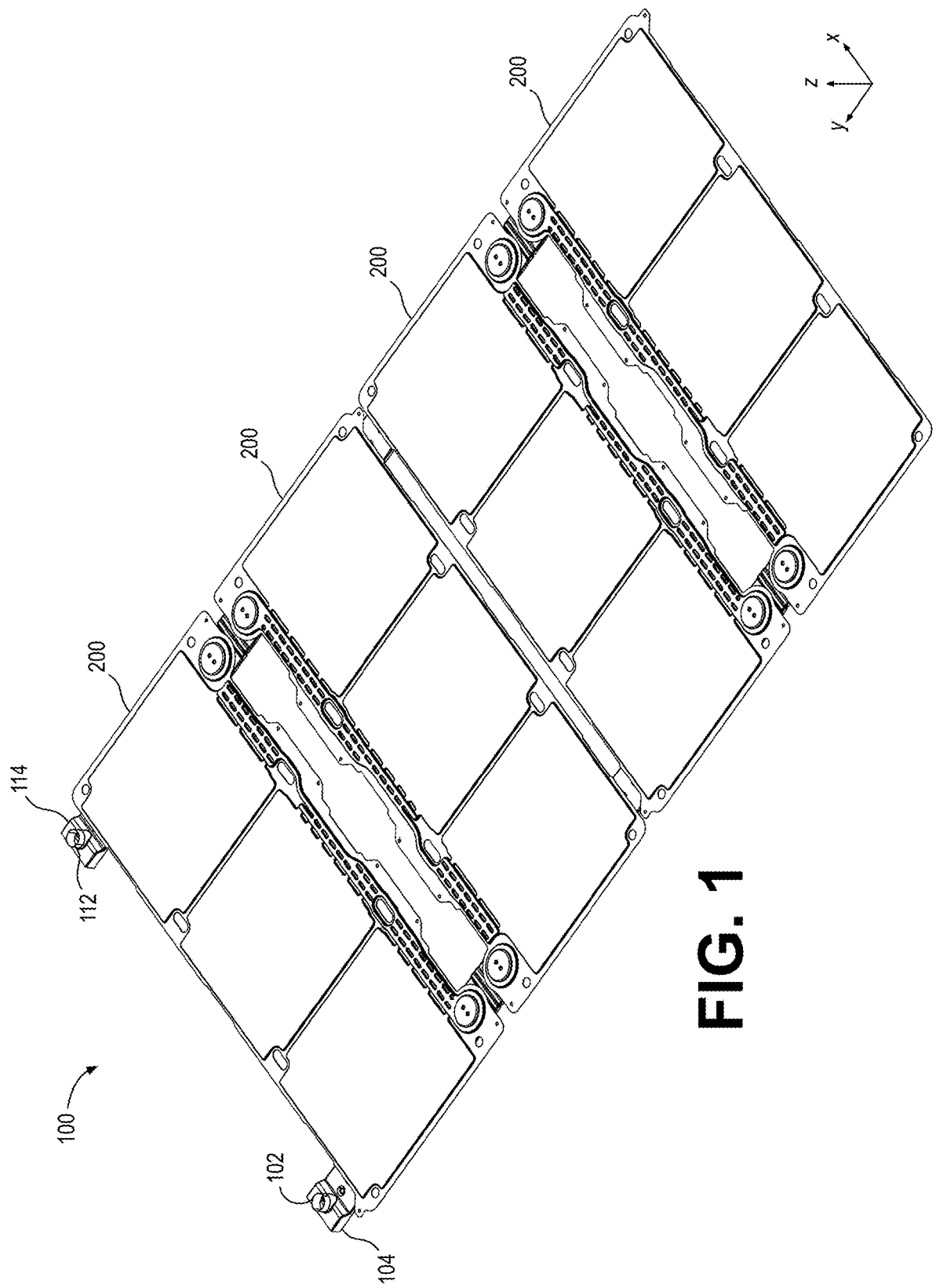
FIG. 1 is a perspective view of an example heat exchanger assembly, of the present invention.

FIG. 1 is a perspective view of an example heat exchanger assembly 100. Heat exchanger assembly 100 includes inlet pipe 102 connected to inlet rail 104, and outlet pipe 112 connected to outlet rail 114. Inlet rail 104 and outlet rail 114 may include connecting bellows or other suitable connectors that provide an expandable fluid connection between separate sections of inlet rail 104 and outlet rail 114. Alternatively, the fluid connections between cooling block 200, inlet rail 104, and outlet rail 114 may allow for relative motion in the x- and y-direction during the service or operation of heat exchanger assembly 100. Cooling blocks 200 extend across, and are fluidly connected between, inlet rail 104 and outlet rail 114. Some cooling blocks 200 are arranged in a first orientation, while other cooling blocks 200 are arranged in a second orientation.

Cooling blocks 200 may be configured so as to be suitably operational in either a forward flow direction or a reverse flow direction, to enable a single cooling block design to be used in multiple orientations. An example cooling block includes a top manifold and coolant port fluidly connected thereto, which conveys coolant into or out of the top manifold. Likewise, the cooling block includes a bottom manifold and respective coolant port fluidly connected thereto, which conveys coolant into or out of the bottom manifold. In a first orientation, such as the left-most cooling block 200 in FIG. 1, the top manifold and coolant port are directly, fluidly coupled to inlet rail 104, while the bottom manifold and respective coolant port are directly, fluidly coupled to outlet rail 112. In the first orientation, the coolant port coupled to the top manifold serves as a coolant inlet and inlet manifold, respectively, while the coolant port coupled to the bottom manifold serves as a coolant outlet and outlet manifold, respectively. In a second orientation, such as the right-most cooling block 200 in FIG. 1, the coolant inlet and coolant outlet are the opposite, where the coolant port coupled to the top manifold serves as a coolant outlet and outlet manifold, respectively, and the coolant port coupled to the bottom manifold serves as a coolant inlet and inlet manifold, respectively.

During operation, coolant enters inlet pipe 102 and flows along inlet rail 104, which extends underneath (e.g., in the negative z-direction) cooling blocks 200. Portions of that coolant enter cooling blocks 200 by way of respective coolant inlet ports or "bosses," which fluidly couple respective inlet manifolds of cooling blocks 200 to inlet rail 104. Coolant then flows through cooling blocks 200, and collects in their respective outlet manifolds. The outlet manifolds of cooling blocks 200 are fluidly coupled to outlet rail 114 by way of respective coolant outlet ports or "bosses." Coolant in outlet rail 114 is then drawn through outlet pipe 112 (e.g., using a pump or other suitable means), and provided to a separate system that reduces the temperature of the coolant, before circulating it back through inlet pipe 102.

In some applications, cooling blocks 200 may have rigidly coupled thereto a set of vertically-extending (e.g., in the positive z-direction) heat sinks or heat transfer fins (not shown) extending from the top surfaces of cooling blocks 200. Such an arrangement allows for thin battery cells to be sandwiched between the heat sinks, which themselves are cooled by cooling blocks 200. However, cooling blocks 200 may be used to regulate the temperature of batteries in other orientations, or used to regulate the temperature of objects other than batteries in a variety of ways.

Figure 2:
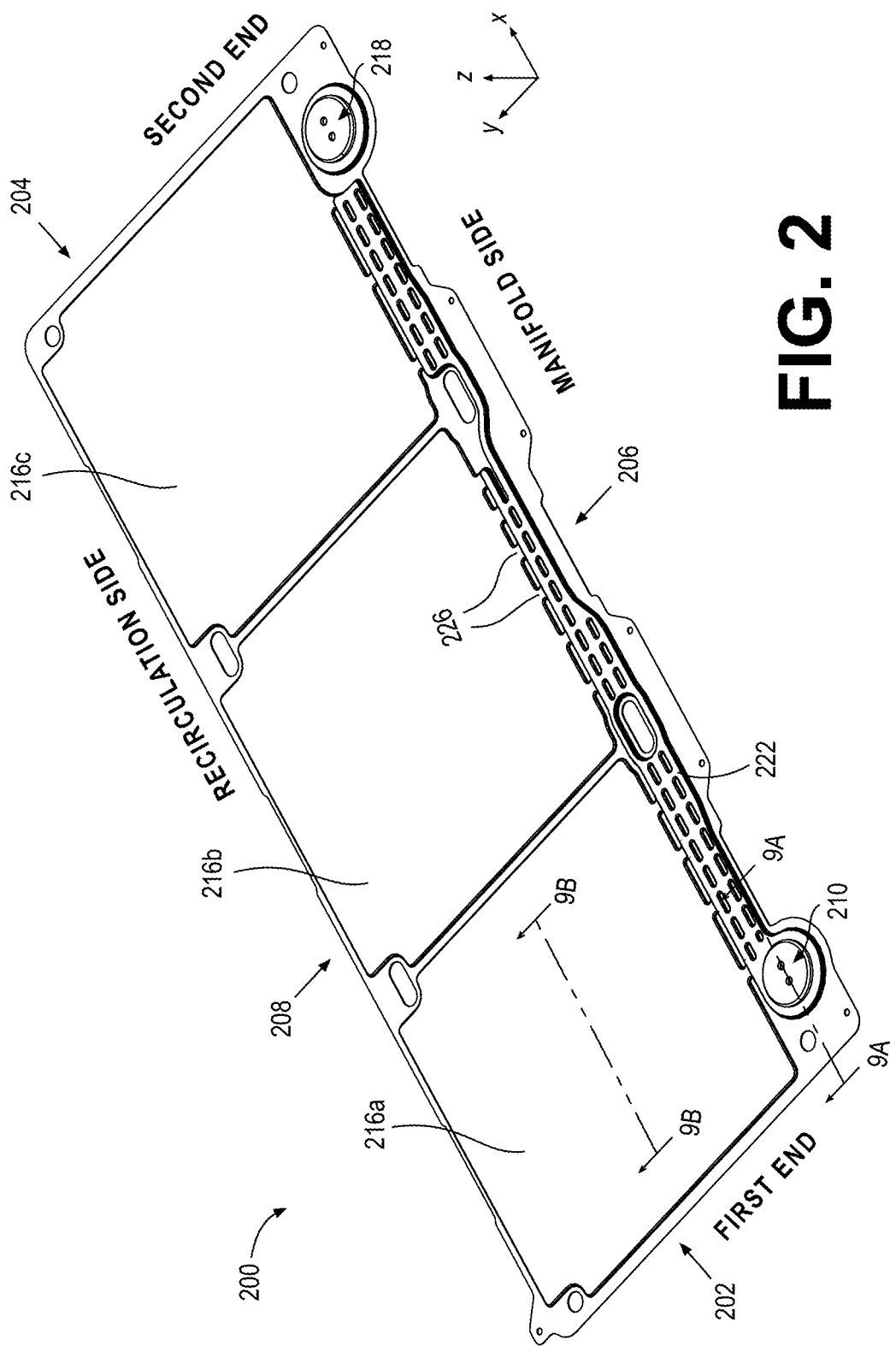
FIG. 2 is a perspective view of an example cooling block of the heat exchanger assembly, according to the embodiment of FIG. 1.

FIG. 2 is a perspective view of cooling block 200, according to the embodiment of FIG. 1. Cooling block 200 comprises three plates: top plate 220 (shown in FIG. 5), middle plate 250 (shown in FIGS. 6A and 6B), and bottom plate 280 (shown in FIGS. 4 and 7). The details of top plate 220 can be seen in the perspective drawing of FIG. 2.

When arranged in a first orientation associated with a forward flow direction, cooling block 200 receives coolant at first coolant port 210, which extends downwardly (in the negative z-direction) into inlet rail 104. The coolant flow path is illustrated in greater detail in FIGS. 8 and 9. First coolant port 210 is positioned within top coolant manifold 222, proximate to first end 202 of cooling block 200. Coolant flows in through first coolant port 210 and is distributed through top coolant manifold 222, which extends substantially across cooling block 200 between its first end 202 and its second end 204.

Figure 3:
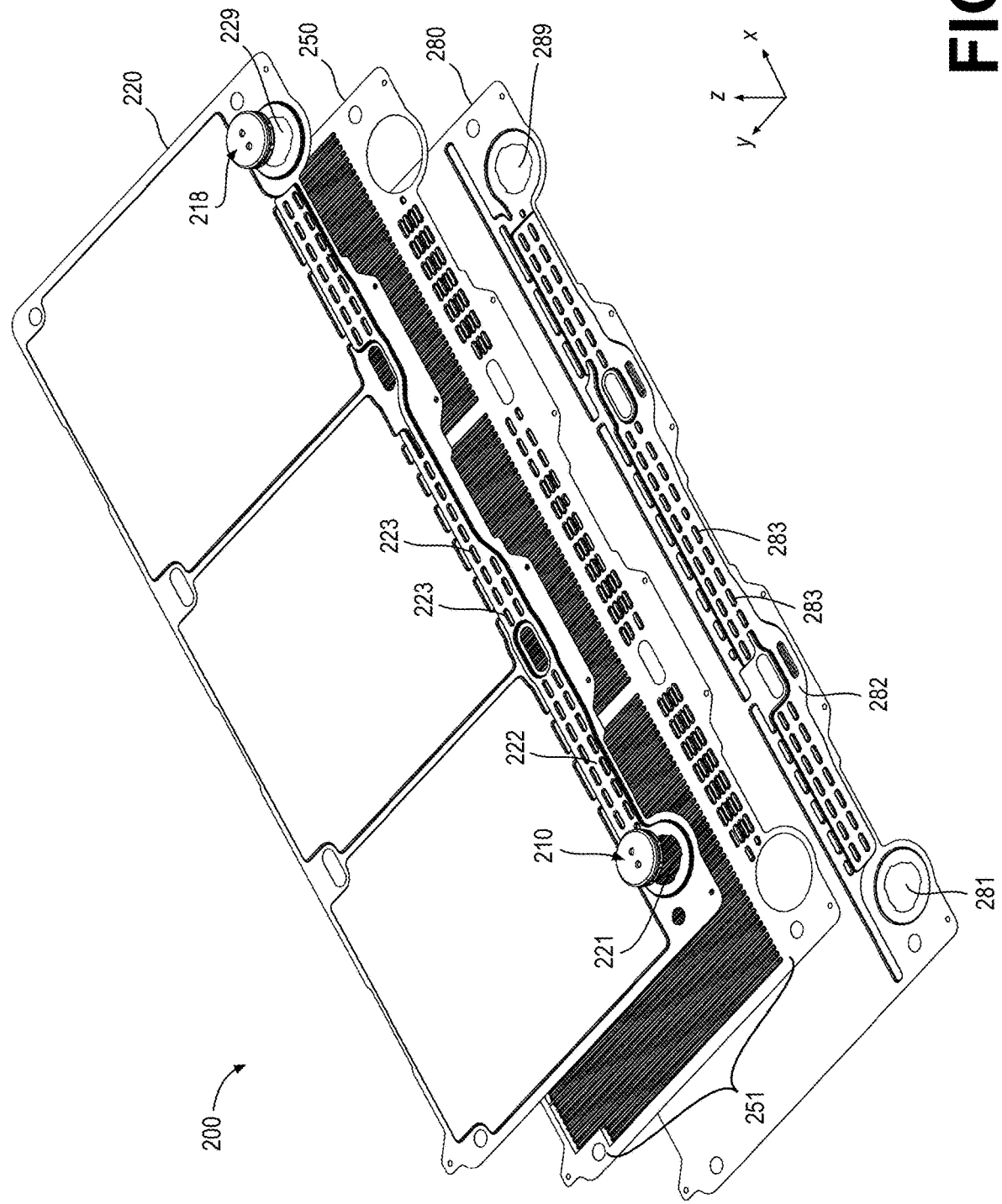
FIG. 3 is an exploded perspective view of the example cooling block, according to the embodiment of FIG. 2.

In this example, cooling block 200 includes three separate "matrixes" 216a, 216b, and 216c. Each matrix corresponds to a separate set of cooling channels, positioned proximate to a respective cooling surface (e.g., the substantially flat, embossed portion) and substantially extending between manifold side 206 and recirculation side 208. Some of these cooling channels, which are shown in greater detail in FIGS. 3 and 6, are fluidly coupled with top coolant manifold 222 by way of coolant apertures 226. In the first orientation associated with a forward flow direction, coolant manifold 222 receives coolant from coolant port 210, and distributes coolant across and through apertures 226.

Referring now to FIGS. 2-7, the remaining coolant flow path is now briefly described, with respect to cooling block 200 being arranged in first orientation associated with a forward flow direction. Coolant distributed through top coolant manifold 222 and through apertures 226 enters a first set of elongated coolant channels, such as channel 254, as shown in FIGS. 6A and 6B, and flows from manifold side 206 toward recirculation side 208, as shown in FIG. 2. The first set of channels are fluidly coupled to a second set of channels, such as channel 252 (see FIGS. 6A and 6B), by way of one or more recirculation apertures, such as aperture 256 in middle plate 250 of FIGS. 6A and 6B, which are positioned proximate to recirculation side 208. Coolant flowing along the first set of channels reverses direction and enters the second set of channels, flowing along the second set of channels from recirculation side 208 toward manifold side 206. Bottom coolant manifold 282 is positioned "beneath" top coolant manifold 222 (in the negative z-direction), which collects coolant from the second set of channels. Coolant collected in the bottom manifold 282 flows out of cooling block 200 through second coolant port 218, which is fluidly coupled to outlet rail 114.

Figure 4:
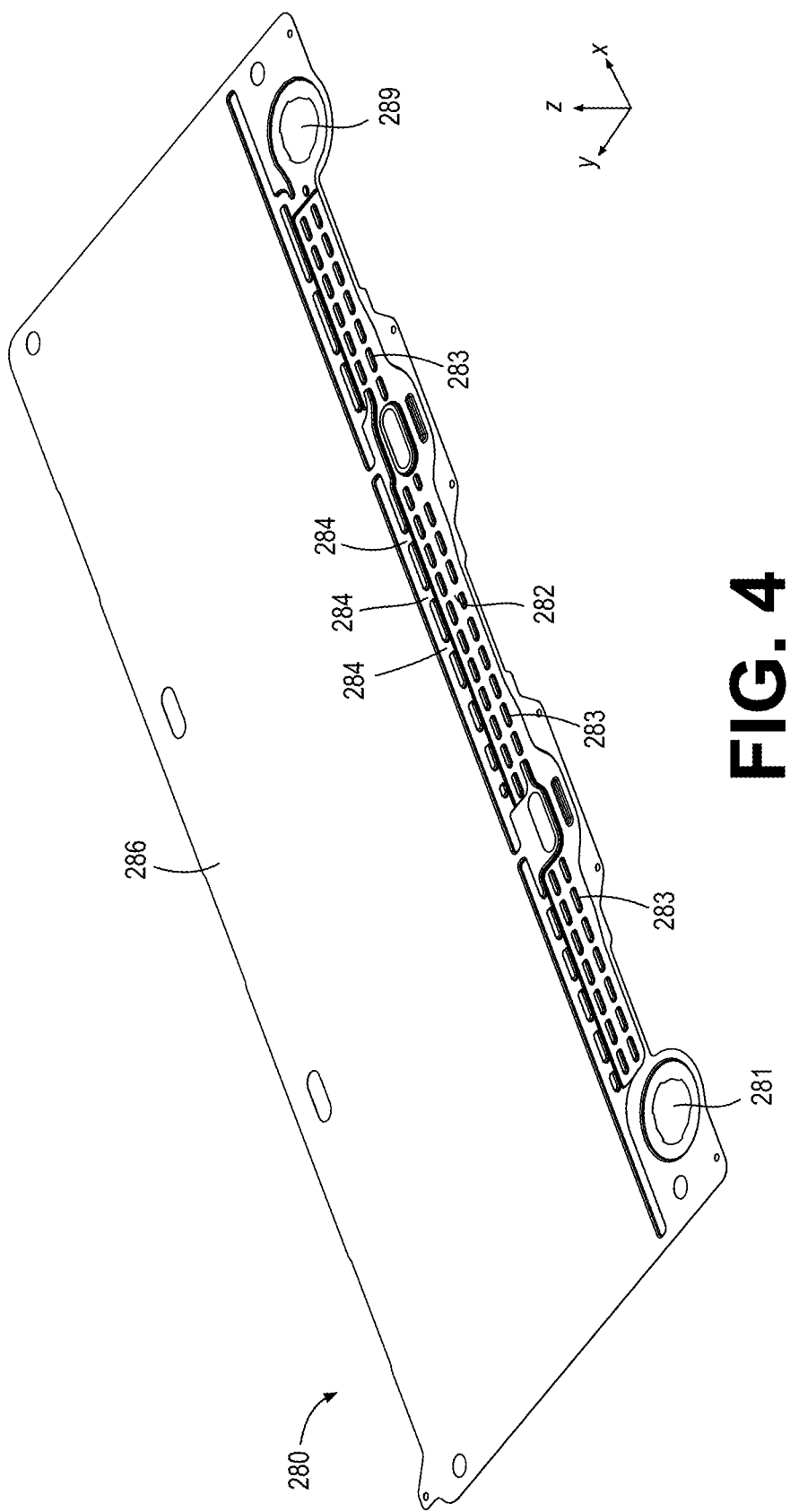
FIG. 4 is a perspective view of the bottom plate of the example cooling block, according to the embodiment of FIG. 2.

When arranged in a second orientation associated with a reverse flow direction, cooling block 200 receives coolant at second coolant port 218, which extends downwardly (in the negative z-direction) into inlet rail 104. Second coolant port 218 is positioned within bottom coolant manifold 282, which is shown in FIGS. 3, 4, and 7, proximate to second end 204 of cooling block 200. Coolant flows in through second coolant port 218 and is distributed through bottom coolant manifold 282, which extends substantially across cooling block 200 between its first end 202 and its second end 204. In the second orientation associated with a reverse flow direction, coolant manifold 282 receives coolant from coolant port 218, distributes coolant across and through apertures 284, and into a respective set of coolant channels.

Figure 6A:
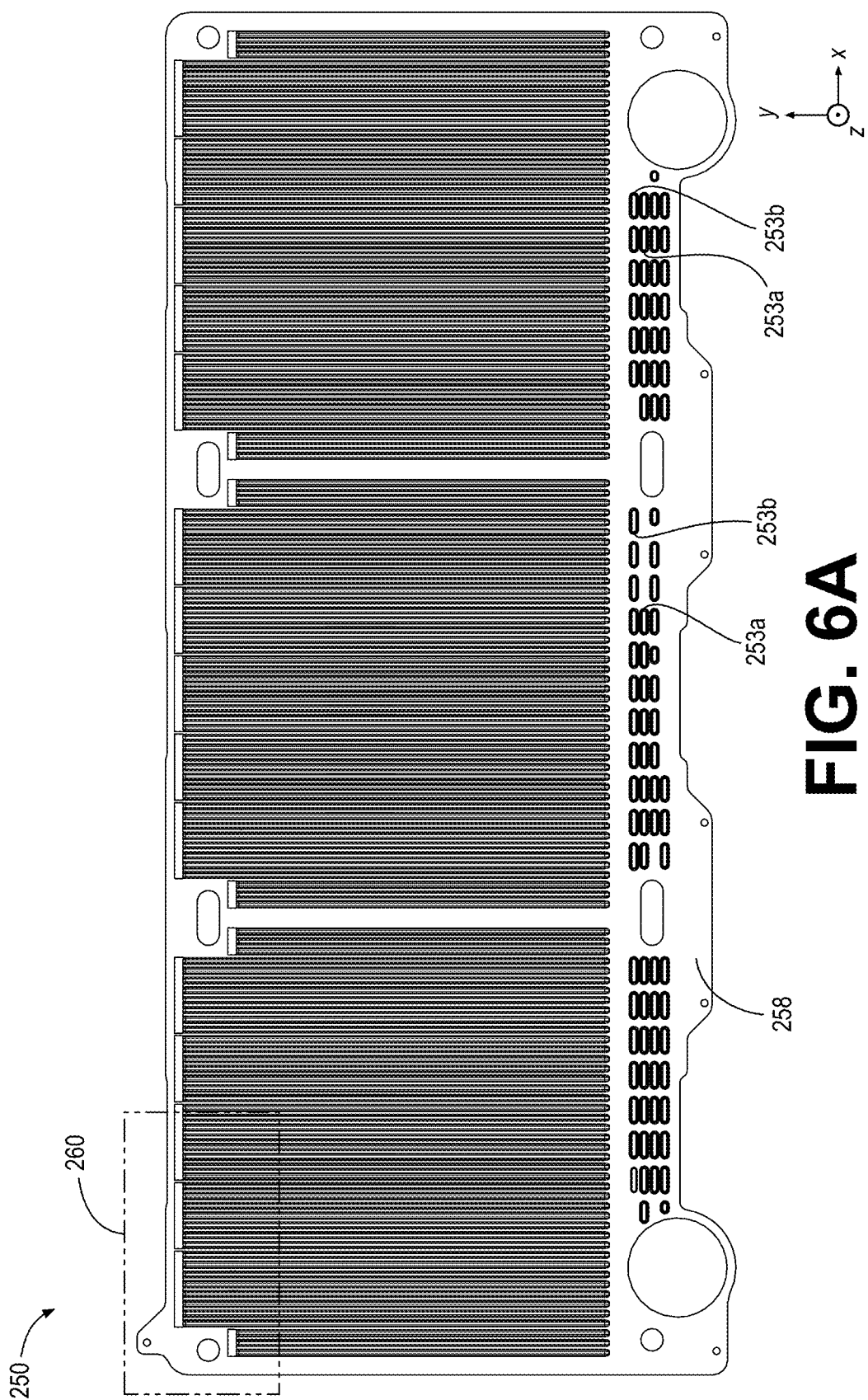
FIG. 6A is a top plan view of the middle plate of the example cooling block, according to the embodiment of FIG. 2.
Figure 6B:
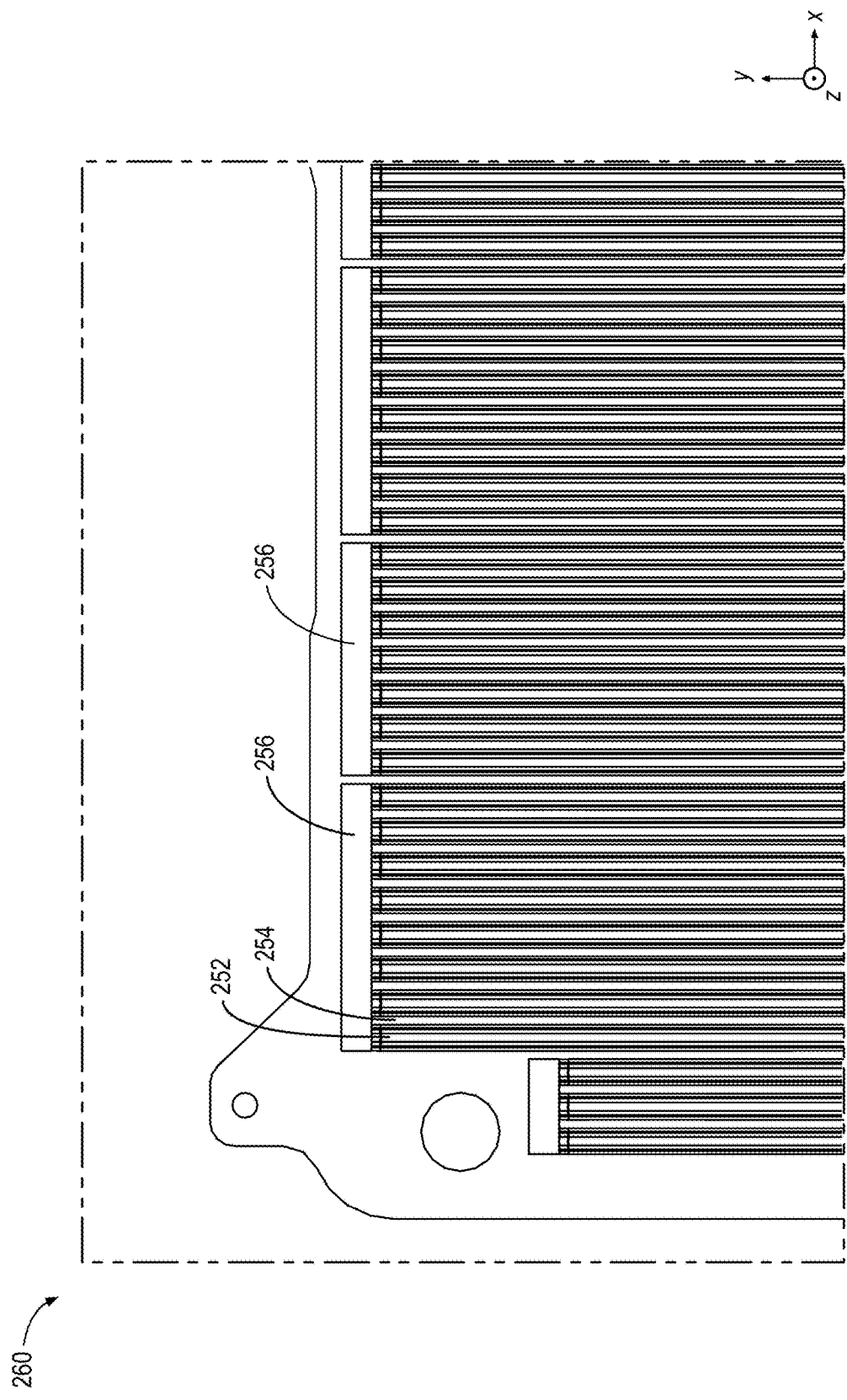
FIG. 6B is an enlarged, detailed top plan view of the middle plate of the example cooling block, according to the embodiment of FIG. 6A.

The remaining coolant flow path, with respect to cooling block 200 being arranged in a second orientation associated with a reverse flow direction, is now briefly described. Coolant distributed through bottom coolant manifold 282 and through apertures 284 enters a second set of elongated coolant channels, such as channel 254, as shown in FIGS. 6A and 6B, and flows from manifold side 206 toward recirculation side 208, as shown in FIG. 2. The second set of channels are fluidly coupled to a first set of channels, such as channel 252 (see FIGS. 6A and 6B), by way of one or more recirculation apertures, such as aperture 256 in middle plate 250 of FIGS. 6A and 6B, which are positioned proximate to recirculation side 208. Coolant flowing along the second set of channels reverses direction and enters the first set of channels, flowing along the first set of channels from recirculation side 208 toward manifold side 206. Top coolant manifold 222 is positioned "above" bottom coolant manifold 282 (in the negative z-direction), which collects coolant from the first set of channels. Coolant collected in the top manifold 222 flows out of cooling block 200 through first coolant port 210, which is fluidly coupled to outlet rail 114.

Top manifold 222 and bottom manifold 282 of cooling block 200 may each include a set of flow-balancing features that serve to distribute coolant in a manner that promotes substantial temperature uniformity, regardless of whether cooling block 200 is arranged in the first orientation associated with a forward flow direction or a second orientation associated with a reverse flow direction. These flow-balancing features are described in more detail below.

FIG. 3 illustrates an exploded view of top plate 220, middle plate 250, and bottom plate 280 of cooling block 200. As shown in FIG. 3, middle plate 250 includes a set of elongated corrugations or ridges 251 extending between manifold side 206 and recirculation side 208. In this specific example, the corrugations are embossed in the positive z-direction, forming a set of ridges with elongated gaps extending between adjacent ridges. The first set of channels, such as channel 254 of FIG. 6B, as described above, are formed between these elongated gaps and the inner surface (the surface facing the negative z-direction) of top plate 220. Similarly, the second set of channels, such as channel 252, are formed between the space "underneath" the elongated ridges and the inner surface (the surface facing the positive z-direction) of bottom plate 280.

As shown in FIG. 3, bottom manifold 282 is positioned directly underneath (in a "stacked" orientation along the z-axis) top manifold 222. In this embodiment, bottom manifold 282 and top manifold 222 have mirrored features, which enable cooling block 200 to be bidirectionally operational. The second set of channels—or the space underneath the elongated ridges of middle plate 250—extend over a portion of bottom manifold 282, to provide a fluid connection between them (see FIG. 11).

As also shown in FIG. 3, top plate 220, middle plate 250, and bottom plate 280 are preferably formed from a heat-conducting material, such as aluminum or other metals. Each plate may be constructed from a sheet of material that is deformed, cut, or otherwise shaped through hydroforming, stamping, or some other manufacturing technique. In addition, top plate 220, middle plate 250, and bottom plate 280 may be sealedly joined together using one or more joining techniques, such as welding, brazing (e.g., nickel brazing), soldering, adhesives, and/or crimping, among other possible techniques. Regardless of the particular manufacturing process or processes employed, the three plates are joined together in a sealed arrangement, such that coolant flow paths are fluid-tight and capable of withstanding pressurized fluid flowing therethrough without leaking coolant or deforming excessively.

Unless otherwise explicitly stated, the following description of the coolant flow paths and cooling block operation are provided in the context of a first orientation associated with a forward flow direction. However, it should be understood that the flow path may be reversed.

Figure 11:
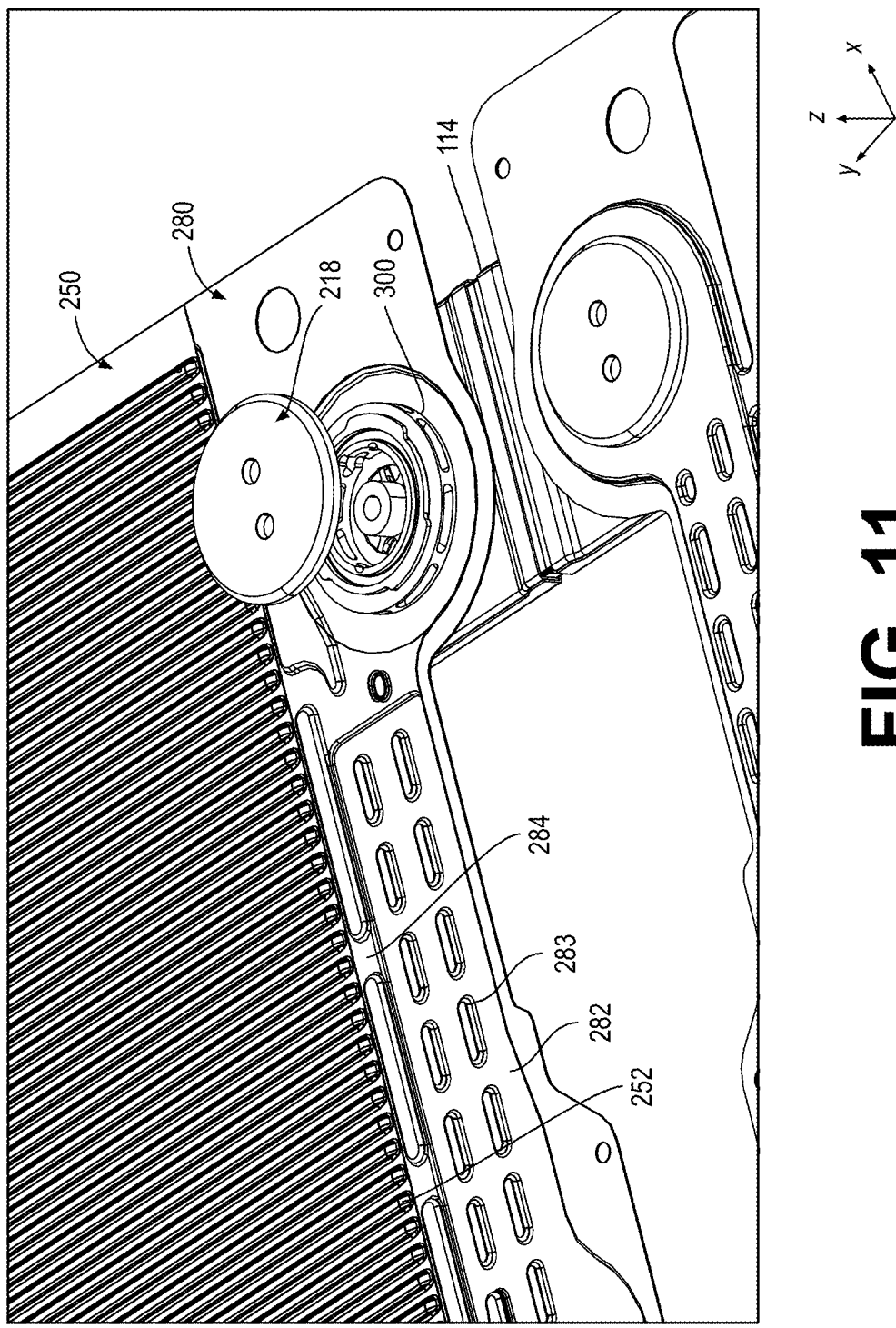
FIG. 11 is an enlarged, detailed perspective cutaway view near a second coolant port of the example cooling block, according to the embodiment of FIG. 1.

FIG. 4 depicts bottom plate 280 in a perspective view. Bottom plate 280 includes first port hole 281, through which first coolant port 210 extends. Flat portion 286 of bottom plate 280 partially forms the walls defining the second set of channels. As shown in FIG. 4, apertures 284 are spaced across and adjacent to bottom manifold 282, which fluidly couples the second set of channels with bottom manifold 282. In a forward flow arrangement, coolant collected in bottom manifold 282 is then directed toward outlet end 204, and through an outlet port defined by the space between second coolant port 218 and second port hole 289, as also shown in FIG. 11.

Figure 5A:
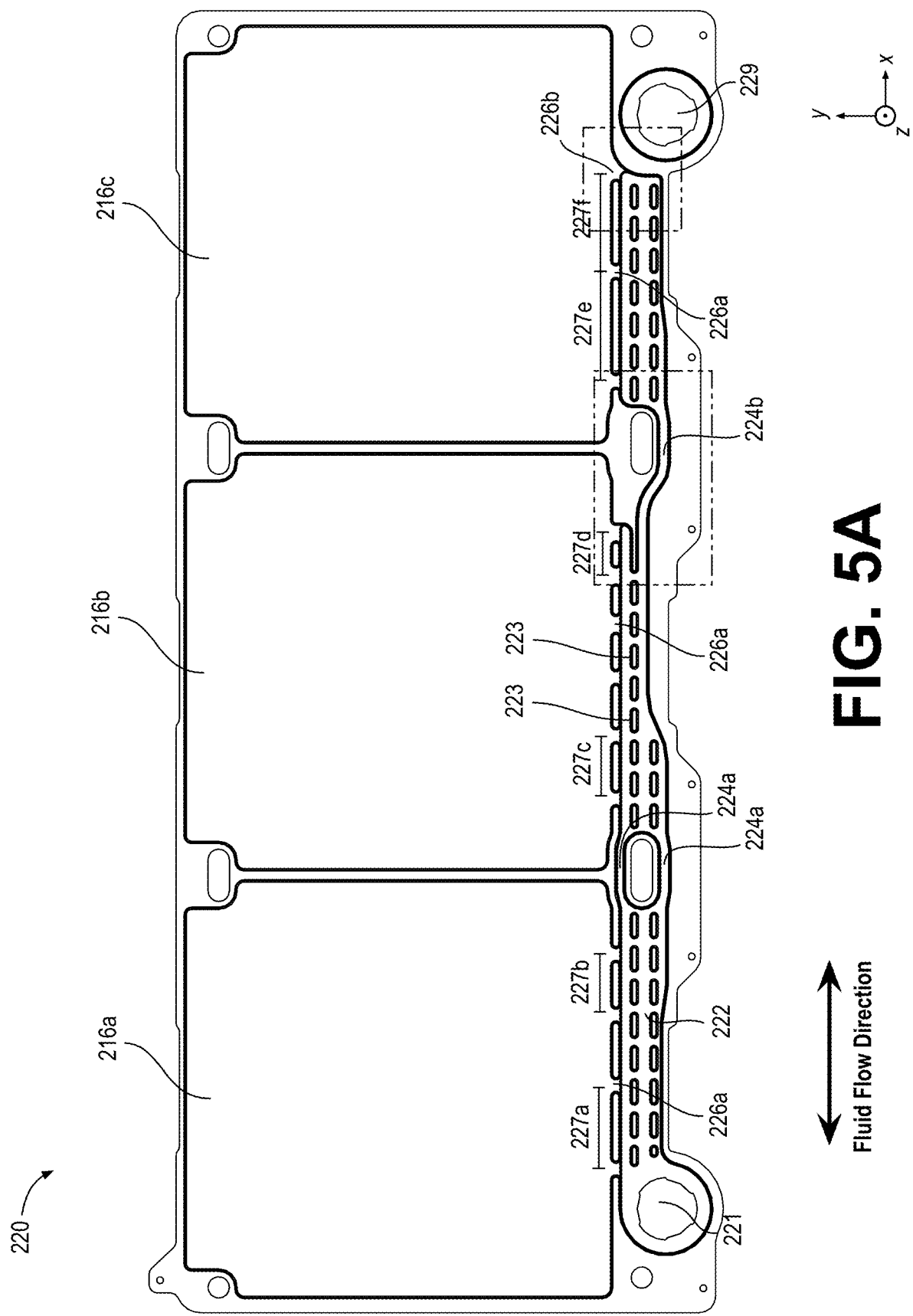
FIG. 5A is a top plan view of the top plate of the example cooling block, according to the embodiment of FIG. 2.
Figure 5B:
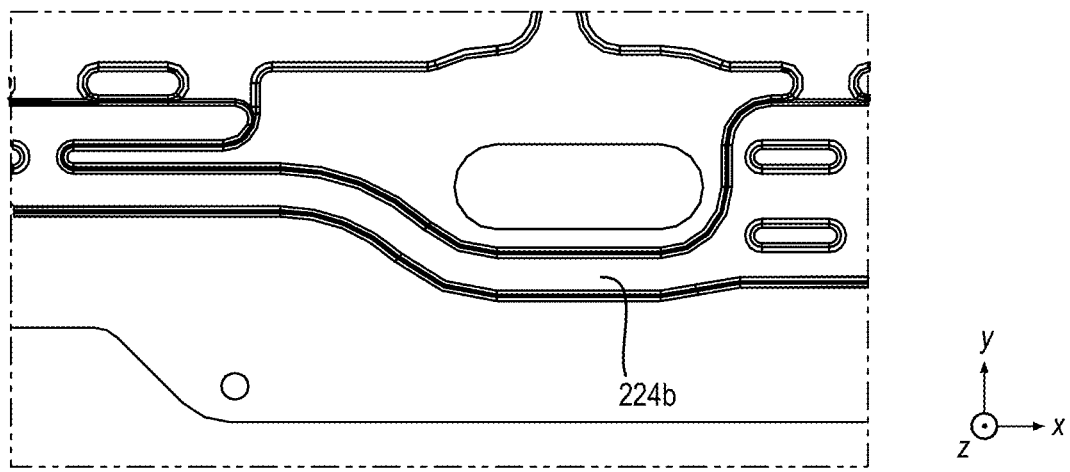
FIG. 5B is a detailed top plan view of a portion of the top plate of the example cooling block, according to the embodiment of FIG. 5A.
Figure 5C:
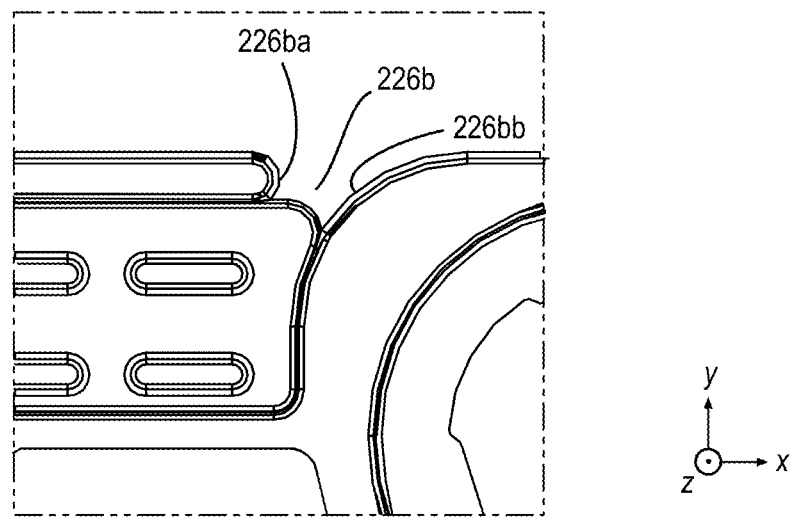
FIG. 5C is a detailed top plan view of a portion of the top plate of the example cooling block, according to the embodiment of FIG. 5A.

FIG. 5A is a top plan view of top plate 220, which has a number of flow-balancing features integrated therein. Top plate 220 includes first port hole 221, through which first coolant port 210 extends to provide a fluid connection between inlet rail 104 or outlet rail 114 and top manifold 222. Likewise, top plate 220 includes second port hole 229, through which second coolant port 218 extends. No direct fluid connection is provided between second coolant port 218 and any of the flow paths defined by top plate 220, so as to seal second coolant port 218. This seal is provided by way of a machined double-surface sealing block 300, which is shown in more detail in FIG. 11 and FIGS. 12A-12C.

As also shown in FIG. 5A, coolant entering through first port hole 221 is distributed across top manifold 222 and into respective coolant channels of matrixes 216a, 216b, and 216c, by way of inlet distribution apertures 226a-b. In this example, matrix 216a is positioned proximate to first end 202, matrix 216c is positioned proximate to outlet end 204, and matrix 216b is positioned between matrixes 216a and 216c.

More particularly, matrixes 216a and 216b receive coolant directed through apertures 226a, while matrix 216c receives coolant directed through apertures 226a and 226b. In some implementations, some or all of apertures 226a-b may vary in size (e.g., have different cross sectional areas), shape, and/or orientation to encourage a particular fluid distribution across matrixes 216a-c.

In some examples, apertures 226a and 226b may have varying cross sectional areas (e.g., 2 to 10 times larger than other apertures, among other possible ratios). Larger distribution apertures may allow for an increased flow rate therethrough, which can compensate for lower fluid velocities and/or pressures. Thus, to the extent that fluid velocities near some apertures are lower than fluid velocities near other apertures, comparatively larger apertures may be used to promote more even coolant distribution between matrixes 216a and 216b.

In applications where fluid velocities and pressures are substantial, coolant entering top manifold 222 may tend to flow toward second end 204 (in the positive x-direction) and past some apertures 226a, toward aperture 226b. Without sufficient backpressure, such circumstances would lead to a greater amount of coolant entering apertures proximate second end 204, compared to the amount of coolant entering distribution apertures near first end 202. Transition channels 224a and transition channel 224b may restrict fluid flow across matrixes 216a, 216b, and 216c, and create backpressures that encourage more even or otherwise particular fluid distribution across matrixes 216a-c.

Continuing with FIG. 5A, transition channels 224a fluidly connect portions of top manifold 222 corresponding to matrixes 216a and 216b. Likewise, transition channel 224b fluidly couples portions of top manifold 222 corresponding to matrixes 216b and 216c. By constricting fluid flow at these transition "choke points" along top manifold 222 in this manner, transition channels 224a and 224b may vary the fluid pressures across the three portions of top manifold 222 adjacent to matrixes 216a, 216b, and 216c during operation, so as to encourage a distribution of coolant that leads to a greater temperature uniformity. The sizes of transition channels 224a and 224b may be the same in some implementations, and different in others. In this example, transition channels 224a may have a combined cross sectional area that is larger than the cross sectional area of transition channel 224b.

In addition, the present application contemplates the variation of aperture orientations by different angles, including more or less severe angles than those of apertures 226a and 226b, as well as distribution aperture angles pointing "away" from or toward the first end 202. Fluid flow rates through particular apertures (e.g., those identified to have excessive or insufficient flow rates) may be adjusted by changing the angles to increase and/or decrease the flow rate through those particular distribution apertures.

In addition, as shown further in FIG. 5A, the shape of a particular aperture may be modified to increase or decrease coolant flow rates through that particular aperture. Apertures not only have a "width" (in the x-direction), but also have a "depth" (in the y-direction), such that two "walls" extend in the y-direction by some amount. A given aperture's angle may be adjusted by angling one or both of its walls. For example, referring to the inset of FIG. 5C, aperture 226b includes one wall 226ba that is substantially parallel to the y-axis, and another wall 226bb that is tilted in the positive-x and positive-y direction. Thus, the cross sectional area of aperture 226b at its boundary with top manifold 222 is approximately the same as the cross sectional area of apertures 226a; however, the cross sectional area of aperture 226b widens along the positive y-direction, due to its angled wall. An aperture with only one angled wall, as in aperture 226b, may also be used to increase or decrease fluid flow rates, depending on the particular implementation.

While different distribution aperture sizes and different transition channel sizes may be used to balance fluid flow rates across matrixes 216a, 216b, and 216c, fluid flow rates across coolant channels within each matrix may not necessarily be even. For instance, with respect to the portion of top manifold 222 associated with matrix 216b, fluid velocities and/or pressures near transition channels 224a may be different from fluid velocities and/or pressures near transition channel 224b. In some cases, as coolant flows into apertures nearer first end 202, fluid pressures and velocities decrease around apertures toward second end 202.

Where such unevenness occurs, the present invention can introduce balance into an intra-matrix fluid flow imbalance, by providing for different spacing between adjacent distribution apertures. As shown in FIG. 5A, distance 227a between two of apertures 226a (nearer first end 202) is greater than distance 227b between a different pair of distribution apertures 226a (nearer outlet end 204). Thus, with respect to matrix 216a, the spacing between apertures 226a decreases in the direction of forward fluid flow (in the positive x-direction).

Similarly, for matrix 216b, distance 227c between two of apertures 226c (nearer first end 202) is larger than distance 227d between another pair of apertures 226a (nearer second end 204). A similar diminishing aperture distance is present in matrix 216c as well, where distance 227e is larger than distance 227f. However, the distances between distribution apertures may not always necessarily decrease in the positive x-direction. For example, distance 227c of matrix 216b may be greater than distance 227b of matrix 216a, despite being closer to second end 202. As shown in FIG. 5A, within a given matrix of cooling block 200, the invention contemplates consistently decreasing distances in the direction of fluid flow.

The extent to which distances between adjacent apertures decreases may vary, depending on the particular implementation. In the example shown and described with respect to FIG. 5A, the distance between each aperture 226a may decrease by approximately 5-10% between each consecutive pair of apertures 226a. However, it should be understood that the distribution aperture spacing may depend on the specific structural limitations of a given implementation.

Thus, as shown and described with respect to FIG. 5A, one or more flow-balancing features may be integrated within a heat exchanger in order to promote a more balanced fluid distribution, both inter-matrix and intra-matrix. By tuning the distribution aperture sizes, shapes, orientations, and spacing, many fluid flow imbalances can be mitigated. Moreover, the existence and/or dimensions of transition channels may be introduced into the inlet manifold to create effective backpressures, particularly in applications that experience substantially high levels of fluid velocities and pressures. Although a specific combination of these flow-balancing features are shown in the figures of the present applications, one or more of these features may be adjusted, tuned, and/or removed entirely, depending on the particular heat exchanger design and operation requirements.

While flow-balancing features are described herein as promoting a more "even" or "balanced" distribution of fluid, the distribution of coolant across matrixes 216a, 216b, and 216c may not necessarily be the same. In some cases, coolant entering coolant port 210 is warmed as the coolant travels from first end 202 toward second end 204, as a result of heat transfer occurring at or near top manifold 222. In such cases, an equal distribution of coolant across matrixes 216a-216c might lead to a larger temperature gradient than if the coolant were distributed unequally. As coolant entering matrix 216a may be cooler in temperature than coolant entering matrix 216c, it may be desirable to distribute a greater amount of coolant (e.g., have a higher coolant flow rate) into matrix 216c than through matrix 216a. Thus, the flow-balancing features described herein may be tuned or otherwise configured to promote an unequal distribution of coolant that promotes a greater temperature uniformity than would be achieved through an equal distribution of coolant. For the purposes of the present application, the term "even" or "balanced" distribution encompasses unequal distributions that promote an even or balanced temperature regulation.

FIG. 6A depicts a top plan view of middle plate 250. An inset of FIG. 6A showing portion of middle plate 250, as indicated by the dashed-line box shown in FIG. 6A, is provided in FIG. 6B. As shown in FIGS. 6A and 6B, a plurality of elongated ridges extend substantially between manifold side 206 and recirculation side 208 of middle plate 250. Each ridge is hollow, such that the walls of the ridges facing the negative z-direction partially define a second set of channels, which includes channel 252. Likewise, spaces or "valleys" between each of the ridges partially define a first set of channels, including channel 254. In this example, the first and second sets of channels are "interlaced" or alternating, to form a counter-flow arrangement.

As also shown in FIGS. 6A and 6B, flat portion 258 of middle plate 250 facing the positive z-direction partially defines the walls of top manifold 222 shown in FIG. 5A. Coolant distributed along top manifold 222 flows through apertures 226 and into the first set of channels, such as channels 254. Near recirculation side 208, the first set of channels terminate at recirculation apertures 256, which are cut out portions of middle plate 250. When fully assembled, coolant flowing through the first set of channels 254 is directed through recirculation apertures 256, reverses direction and, in turn, flows into and along the second set of channels, including channel 252. This recirculation portion of the coolant flow path is depicted in greater detail in FIG. 10.

Figure 7A:
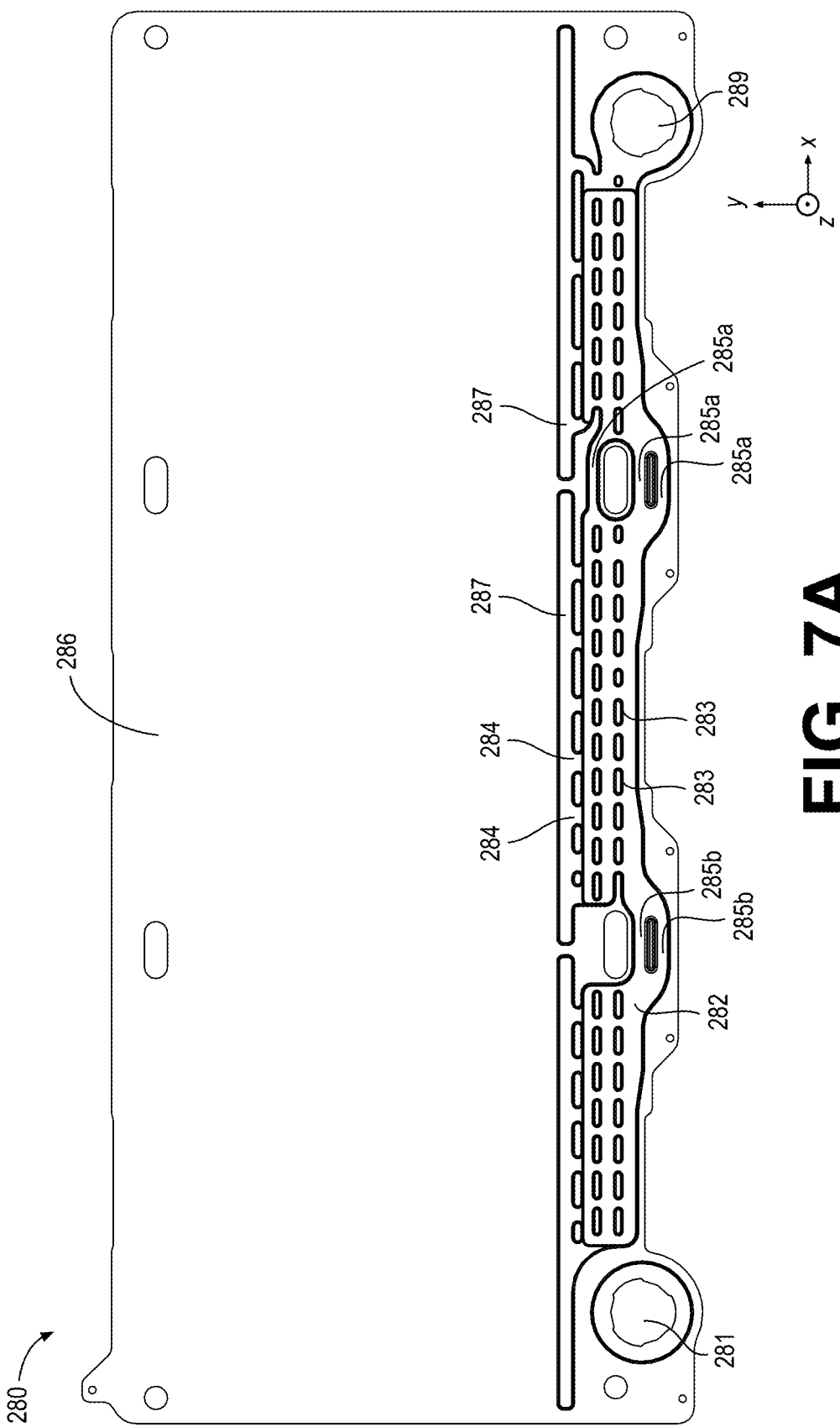
FIG. 7A is a top plan view of the bottom plate of the example cooling block, according to the embodiment of FIG. 2.

FIG. 7A shows a top plan view of bottom plate 280. Apertures 284 are spaced apart in a manner similar to that of apertures 226a and 226b, with distances between adjacent apertures 284 generally decreasing moving from second end 204 toward first end 202 for a given set of apertures 284 associated with a respective matrix. In addition, bottom coolant manifold 282 of bottom plate 280 includes transition channels 285a and 285b, which are functionally similar to transition channels 224a and 224b in top manifold 222. Transition channels 285a and 285b may restrict the flow of coolant across bottom manifold 282, creating backpressures that in turn affects the distribution of coolant across cooling block 200. Furthermore, a plurality of protrusions 283 are integrally formed within bottom manifold 282, which enhances the structural integrity of bottom manifold 282, as well as increases the turbulence of coolant flowing therethrough.

When operating in a reverse flow direction, the spacing of apertures 284, transition channels 285a and 285b, and the plurality of protrusions 283 collectively serve as fluid-balancing features that enables the bottom manifold 282 to serve as the inlet manifold, and second coolant port 218 to serve as the coolant inlet. In other words, first coolant port 210 and second coolant port 218 may each serve as a coolant inlet or a coolant outlet, thereby enabling the same cooling block design 200 to be used in multiple orientations.

Figure 7B:
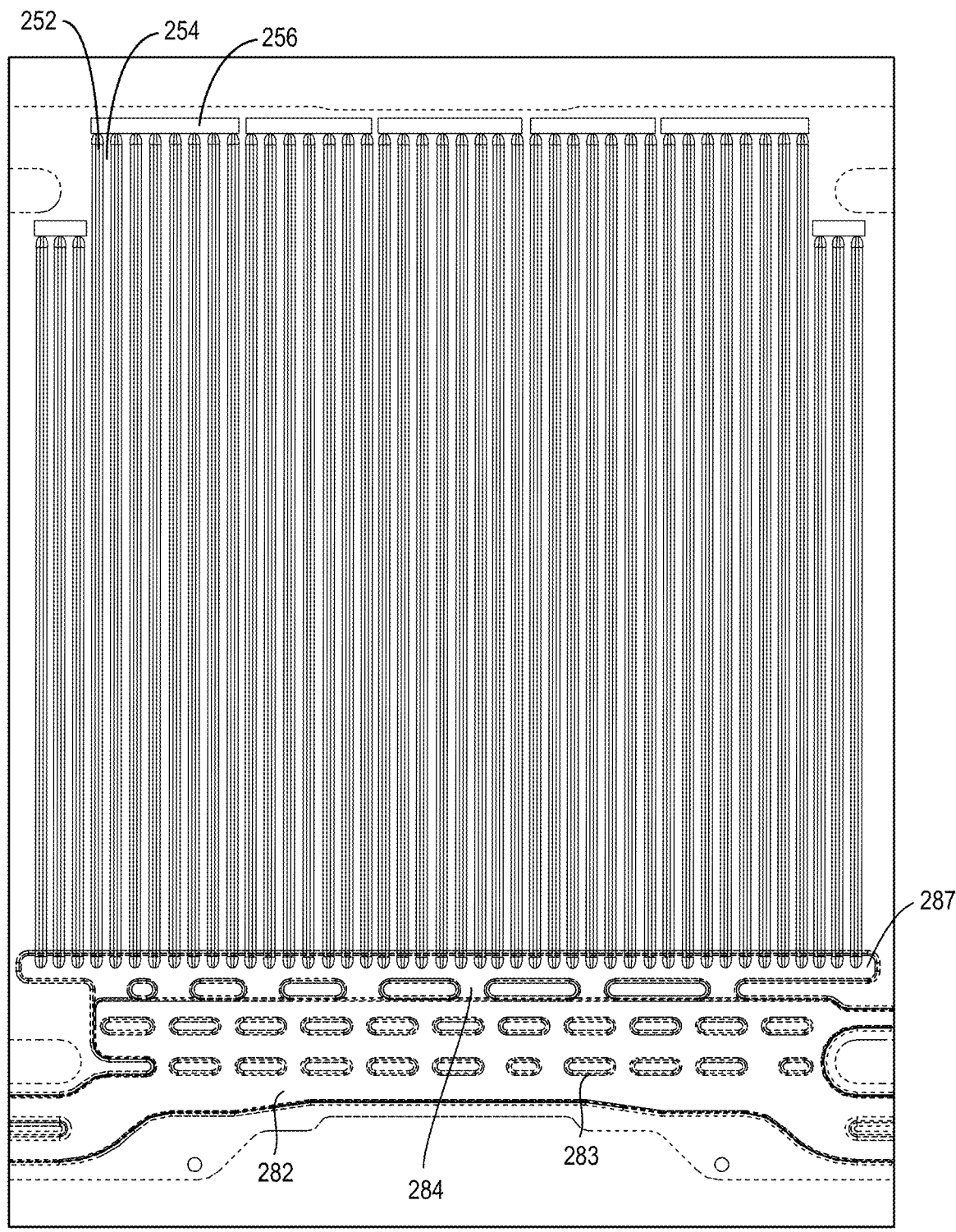
FIG. 7B is an enlarged, detailed top plan view of a matrix of the bottom plate of the example cooling block, according to the embodiment of FIG. 2

FIG. 7B also depicts a few elongated depressions 287 adjacent to apertures 284 in the positive y-direction. The manifold-side tips of the ridges of middle plate 250 overlap (in the z-direction) with elongated depressions 287, so as to fluidly connect the second set of channels 252 with outlet collection apertures 284 (see FIG. 7B).

Figure 8:
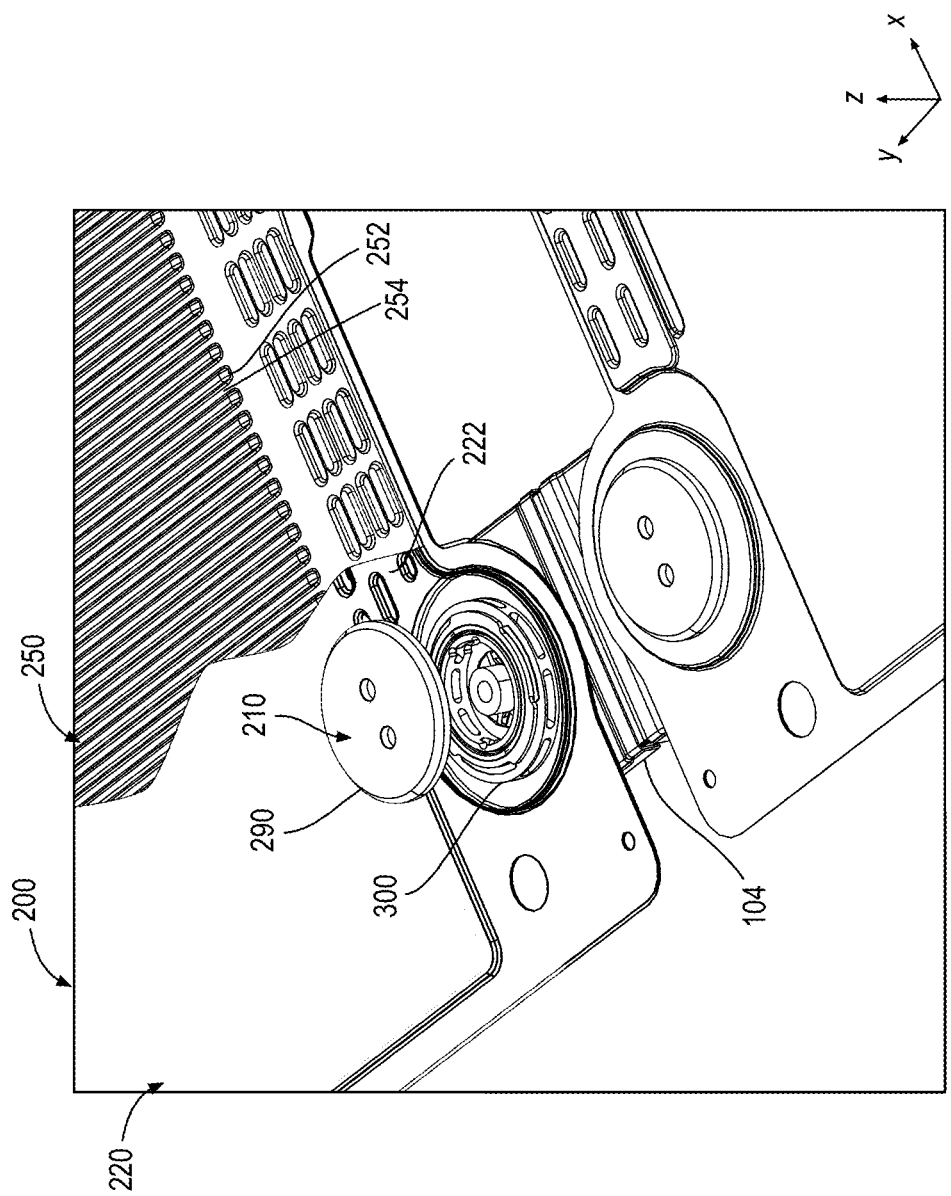
FIG. 8 is a detailed cutaway perspective view of the example cooling block near a first coolant port, according to the embodiment of FIG. 1.

FIG. 8 illustrates a detailed phantom perspective view, near first coolant port 210 of cooling block 200. On the left side of the drawing, top plate 220 obscures middle plate 250, whereas on the right side of the drawing, middle plate 250 is shown. During a forward flow operation, a portion of coolant flowing through inlet rail 104 is directed upwardly through first coolant port 210, defined by a boss engaged with sealing block 300 (which is shown in more detail in FIGS. 12A-12C), and into top manifold 222. As coolant passes through top manifold 222, portions of that coolant flow through apertures 226, and into the first set of coolant channels, such as channel 254.

Figure 9A:
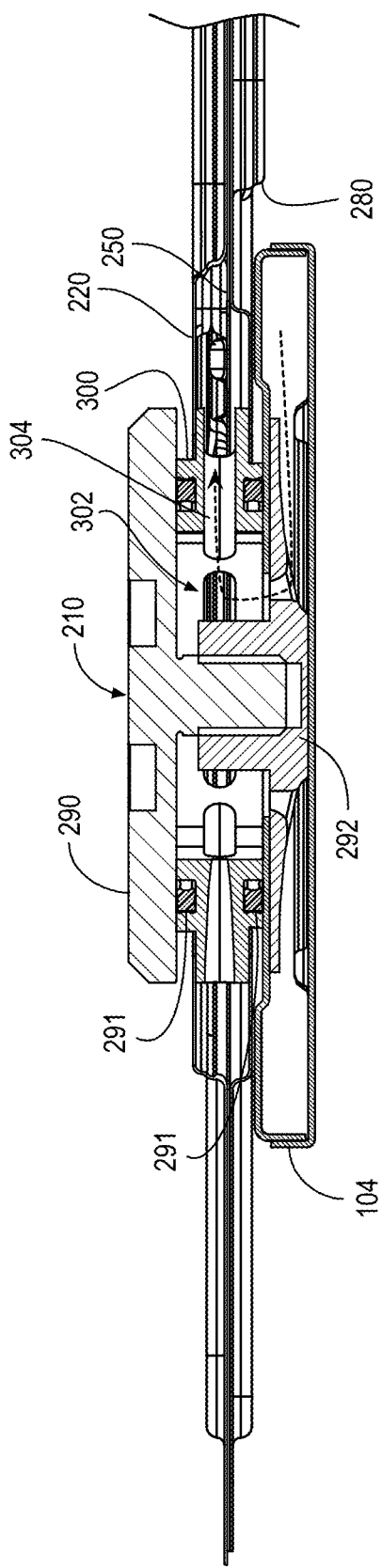
FIG. 9A is an elevated, cross-sectional side view of the invention illustrating a fluid flow path near the first coolant port of the example cooling block, according to the embodiment of FIG. 2, taken along lines 9A-9A and looking in the direction of the arrows.

FIG. 9A illustrates a cross-sectional view of the coolant flow path positioned near first coolant port 210, for directing coolant into cooling block 200, taken along line 9A-9A shown in FIG. 2. Dashed line arrows are provided in FIG. 9A to depict the flow path of coolant from inlet rail 104, up through holes in sealing block 300, and into top manifold 222—as defined by the space between top plate 220 and middle plate 250 visible in the cross-sectional view of FIG. 9A. Bottom manifold 282, while partially shown in FIG. 9A, does not have a direct fluid connection with the inlet rail 104.

The coolant flow path may be designed to allow relative movement of cooling block 200, in a way that specifically seals sealing block 300 and the inlet rail 104 by way of boss 292 and bolt 290 in the x- and y-directions, without reducing the sealing and clamping forces in the z-direction.

Figure 9B:
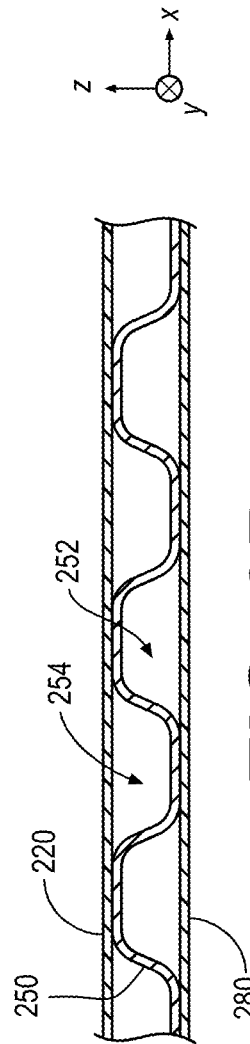
FIG. 9B is an elevated, cross-sectional side view illustrating the cooling channels of the example cooling block, according to the embodiment of FIG. 2, taken along lines 9B-9B of FIG. 2, looking in the direction of the arrows.

Some coolant entering inlet manifold is directed through apertures 226a and 226b, into the first set of channels 254. FIG. 9B depicts a cross-sectional view of the first set of channels 254 and the second set of channels 252, taken along lines 9B-9B shown in FIG. 2. As shown in FIG. 9B, middle plate 250 includes a set of ridges and "valleys," or spaces between the ridges. The spaces between the ridges, in conjunction with top plate 220, form the first set of channels 254. Likewise, the area underneath the ridges, in conjunction with bottom plate 280, forms the second set of channels 252.

Figure 10:
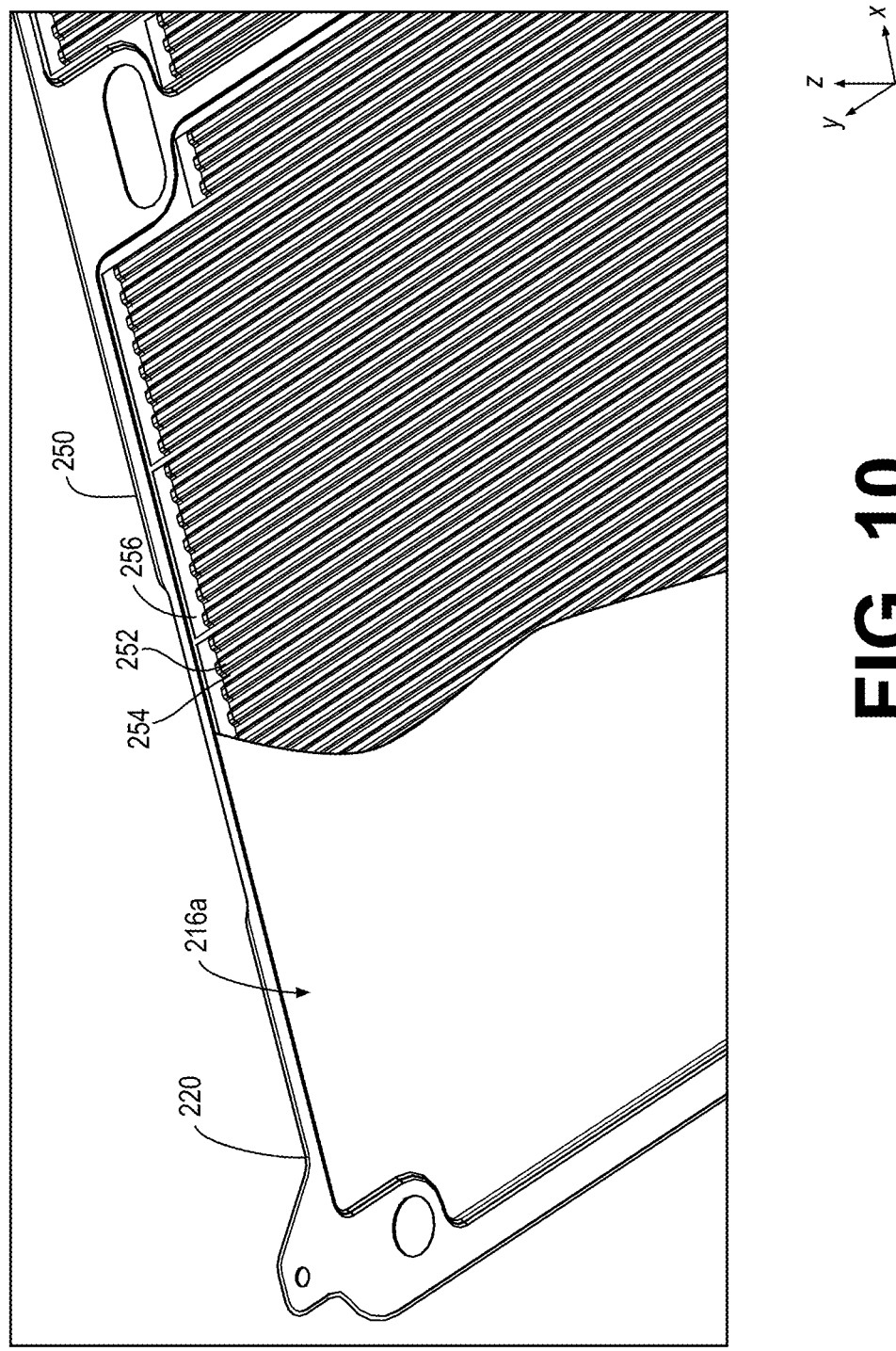
FIG. 10 is a detailed, perspective cutaway view, proximate to the recirculation side of the cooling block, according to the embodiment of FIG. 2.

FIG. 10 illustrates a detailed phantom perspective view near recirculation side 208 of cooling block 200. On the left side of the drawing, top plate 220 obscures the middle plate, whereas on the right side of the drawing, middle plate 250 is shown. As is shown in FIG. 10, the tips of the elongated ridges of middle plate 250 extend up to recirculation apertures 256, to allow coolant flowing along feed channels 254 to flow through recirculation apertures 256 and into hollow return channels 252 formed in the space beneath the ridges, or vice versa. It will be appreciated by one skilled in the art that, instead of providing an aperture or apertures in the middle plate to permit recirculation of coolant between the feed and return channels, the middle plate may be shorter in length (in the y-direction) and terminate at or near the end of the elongated ridges, to provide an extended opening substantially spanning across the width (in the x-direction) of cooling block 200, so as to likewise enable recirculation of coolant. A flanged region of top plate 220 extends along recirculation side 208, which is sealedly engaged to a flat portion of middle plate 250.

FIG. 11 depicts a detailed phantom perspective view near second coolant port 218 of cooling block 200. On the top side of the drawing, middle plate 250 partially obscures bottom plate 280, with the phantom line extending along the tips of the second set of coolant channels 252. As coolant travels along return channels 252 underneath the ridges of middle plate 250, it is collected along depressed region 287 proximate to apertures 284. The coolant then flows through apertures 284, into bottom manifold 282, and toward second coolant port 218. Holes in sealing block 300 allows coolant to exit bottom manifold 282, and flow into outlet rail 114.

FIGS. 12A-12C depict different views of sealing block 300. Sealing block 300 may be a machined, double-surface annular distributor, having central space 302 and a plurality of circumferentially spaced passages extending between the central space 302 and the outer periphery of the distributor. As shown in FIG. 9A, a portion of bolt 290 extends into central space 302 of corresponding boss 292. In this example embodiment, bolt 290 may threadedly advance into boss 292, thereby permitting the tightening of bolt 290 and the compression of sealing block 300 between bolt 290 and boss 292, to form a fluid-tight seal between inlet rail 104 and the inner coolant pathways of cooling block 200 (see FIG. 9A). In this arrangement, neither top plate 220 nor bottom plate 280 are compressed or deformed by bolt 290 and boss 292, and sealing block 300 does not serve as a structural support between top plate 220 and bottom plate 280. Rather, top plate 220 and bottom 280 may be joined to sealing block 300 (e.g., by way of brazing, welding, adhesive, etc.), which itself is compressed between bolt 290 and boss 292. Furthermore, middle plate 250 is not joined to sealing block 300. Sealing block 300 may also include ring-shaped regions into which an elastomeric or rubber "O-ring" 291 can be fitted, to provide a sufficiently fluid-tight seal and prevent coolant from leaking at first coolant port 210 and second coolant port 218. Sealing block 300 may advantageously allow for relative movement of cooling block 200 and coolant inlet rail 104 (and/or coolant outlet rail 114), in at least two axes of motion (e.g., in the x-direction and in the y-direction).

FIG. 13 illustrates an example arrangement of battery pack 130, which is in contact with, and extending from, the matrix 216a section of cooling block 200 within heat exchanger assembly 100. In one example arrangement, thin battery cells (e.g., rectangular lithium ion cells) may be positioned between metal fins, thereby forming battery pack 130. As the battery cells of battery pack 130 are charged and discharged, temperature fluctuations in battery pack 130 are regulated by cooling block 200 of heat exchanger assembly 100. A thermal management system that incorporates heat exchanger assembly 100 may include other structural elements that enclose heat exchanger assembly 100, battery pack 130, metal fins, and/or other components. In some embodiments, battery pack 130 and/or other heat-transfer components may extend near or over top coolant manifold 222, as is shown in FIG. 13.

Figure 14A:
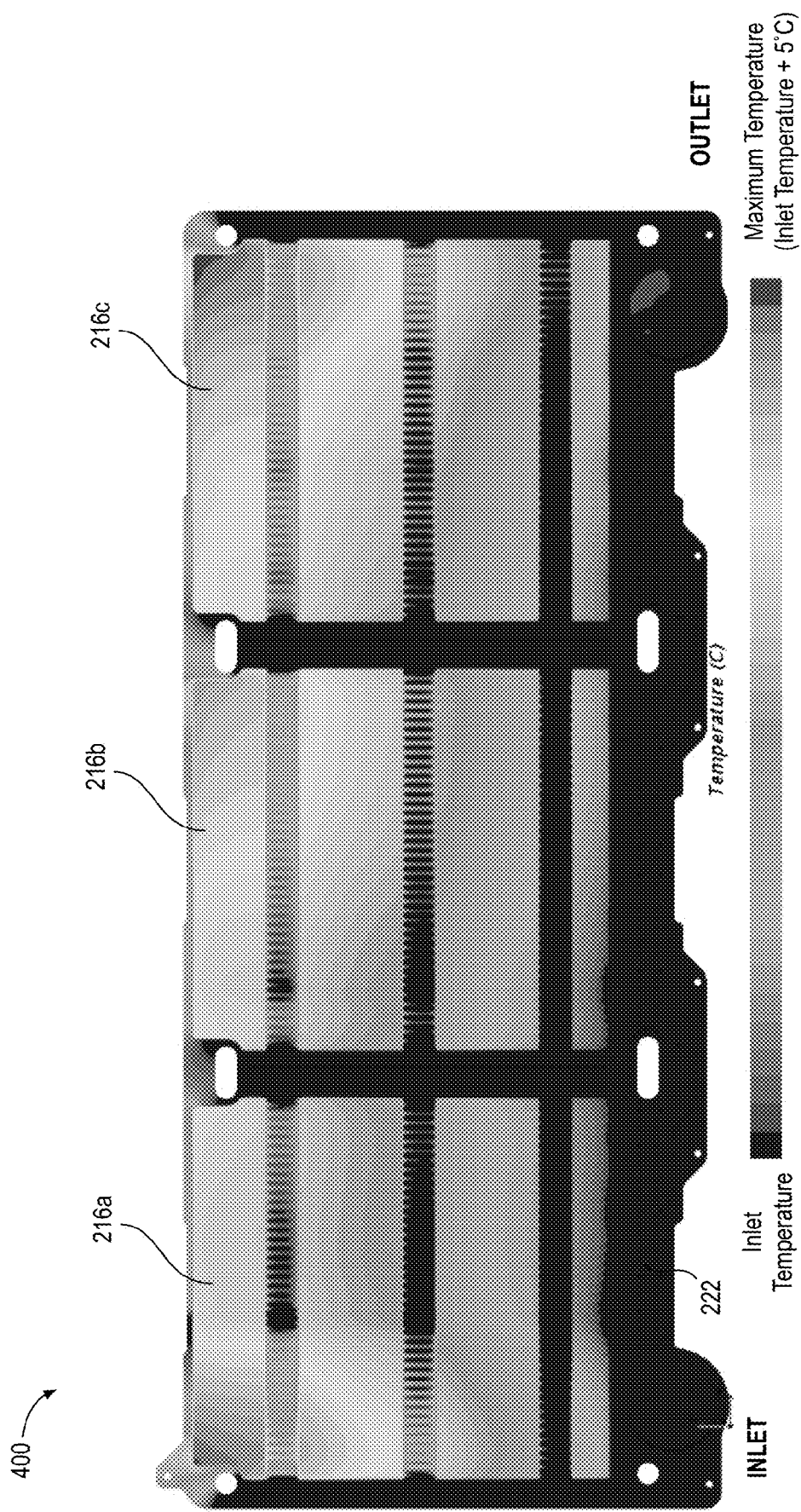
FIG. 14A illustrates a thermal gradient display representing temperatures measured along the top plate of the cooling block, during a forward flow simulation.

FIG. 14A is a thermal gradient display 400, representing temperatures measured along top plate's 220 cooling surfaces during a forward-flow performance simulation. Cooling block 200 shown and described herein was modeled in a computer aided design (CAD) program. A simulation was then performed, using parameters expected during operation of heat exchanger assembly 100 in a real world environment (e.g., between one and ten liters per minute, among other possible flow rates). The program also simulated heat-generating objects, which transferred heat into the simulated coolant.

The simulation demonstrated that the example heat exchanger assembly 100 is capable of maintaining battery temperatures at or near their optimum operating conditions. In addition, the simulated heat exchanger assembly 100 revealed that the largest thermal gradient across the cooling block was approximately 4 to 5 degrees Celsius (between the upper right corner of matrix 216b and the bottom left corner of matrix 216a)—a substantial improvement, at least in terms of temperature uniformity, over many low-profile plate-type heat exchangers. The present application contemplates tuning the flow-balancing features described herein to achieve even greater temperature uniformity. The heat exchangers integrating flow-balancing features described herein, therefore, are suitable in a variety of applications, including the thermal management of high-performance battery systems.

Figure 14B:
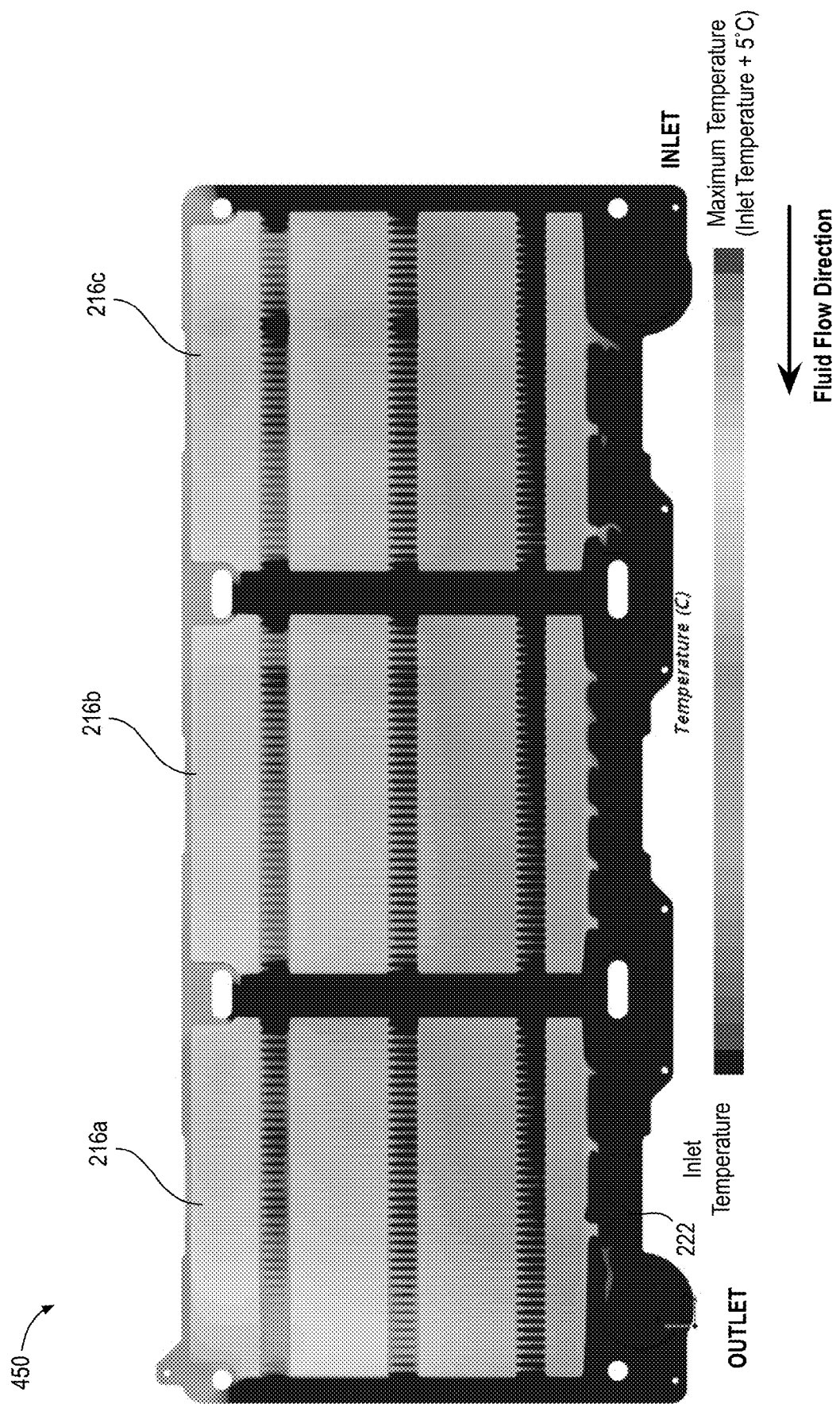
FIG. 14B illustrates a thermal gradient display representing temperatures measured along the top plate of the cooling block, during a reverse flow simulation.

FIG. 14B is a thermal gradient display 450, representing temperatures measured along top plate's 220 cooling surfaces during a reverse-flow performance simulation, in which the direction of coolant flow was reversed compared to the simulation that produced gradient display 400. Cooling block 200 shown and described herein was modeled in a computer aided design (CAD) program. A simulation was then performed, using parameters expected during operation of heat exchanger assembly 100 in a real world environment (e.g., between one and ten liters per minute, among other possible flow rates). The program also simulated heat-generating objects, which transferred heat into the simulated coolant.

Gradient display 450 demonstrated that the example heat exchanger assembly 100 is not only capable of providing a suitable level of temperature regulation with coolant flowing from first coolant port 210 through toward second coolant port 218, but is also capable to providing a similar level of temperature regulation when coolant is flowing in the opposite direction. The present application contemplates tuning the flow-balancing features described herein, in both top manifold 222 and bottom manifold 282, to achieve even greater temperature uniformity, regardless of the direction in which coolant flows through cooling block 200.

Although certain example methods and apparatus have been described herein, the scope of coverage of this patent is not limited thereto. On the contrary, this patent covers all methods, apparatuses, and articles of manufacture fairly falling within the scope of the appended claims, either literally or under the doctrine of equivalents.

It should be understood that arrangements described herein are for purposes of example only. As such, those skilled in the art will appreciate that other arrangements and other elements (e.g. machines, interfaces, operations, orders, and groupings of operations, etc.) can be used instead, and that some elements may be omitted altogether, according to the desired results. Further, many of the elements that are described are functional entities that may be implemented as discrete or distributed components or in conjunction with other components, in any suitable combination and location, or as other structural elements described as independent structures may be combined.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. It is also to be understood that the terminology used herein is for the purpose of describing particular implementations only, and is not intended to be limiting.

What is claimed is:

1. A heat exchanger for regulating the temperature of objects using a coolant, said heat exchanger adapted for bidirectional coolant flow between a first coolant port and a second coolant port, and said heat exchanger comprising:
    a top plate, a bottom plate, and a middle plate operably situated between said top and bottom plates, said top, middle, and bottom plates being sealedly engaged for circulation of said coolant, and collectively forming a stacked cooling block having a first end and a second end substantially opposite the first end, and a manifold side and a recirculation side substantially opposite the manifold side, each of said manifold and recirculation sides being operably positioned between each of said first and second ends, respectively;
    a first coolant port through which coolant is conveyed into or from coolant passageways formed between the top and middle plates;
    a second coolant port through which coolant is conveyed into or from coolant passageways formed between the middle and bottom plates;
    a plurality of coolant flow channels extending substantially between said manifold and recirculation sides, said plurality of coolant flow channels comprising a first set of coolant channels formed between the top and middle plates and a second set of coolant channels formed between the bottom and middle plates, wherein the first set of coolant channels and the second set of coolant channels are fluidly connected through one or more recirculation apertures that are formed by said middle plate proximate to said recirculation side, or are defined by space between said top and bottom plates extending beyond an edge of said middle plate;

a top coolant manifold formed between the top and middle plates proximate to said manifold side and extending substantially between said first end and said second end, said top coolant manifold being adapted to convey coolant through said first coolant port positioned proximate to said first end, and is adapted to direct coolant to and from said first set of coolant channels via a first plurality of coolant apertures positioned therebetween; and a bottom coolant manifold formed between the bottom and middle plates proximate to said manifold side and extending substantially between said first end and said second end, said bottom coolant manifold being adapted to direct coolant to and from said second set of coolant channels and said bottom coolant manifold via a second plurality of coolant apertures positioned therebetween, and adapted to convey coolant through said second coolant port positioned proximate to said second end, said first coolant port being operably interchangeable with said second coolant port without materially affecting the temperature regulation effects of the heat exchanger, wherein said first coolant port serving as a coolant inlet and said second coolant port serving as a coolant outlet defines a forward flow direction, and wherein said second coolant serving as the coolant inlet and said first coolant port serving as the coolant outlet defines a reverse flow direction, having substantially the same coolant cooling effectiveness.

2. The heat exchanger according to claim 1, in which said heat exchanger is configured for positioning with and fluid coupling to a coolant source and a coolant drain, such that said heat exchanger can be oriented in either (i) a first orientation in which said first coolant port is coupled to the coolant source and said second coolant port is coupled to the coolant drain, or (ii) a second orientation in which said first coolant port is coupled to the coolant drain and said second coolant port is coupled to the coolant source, without materially affecting the temperature regulation effects of the heat exchanger.

3. The heat exchanger according to claim 1, in which said top coolant manifold is configured to circulate coolant into the first set of coolant channels in accordance with a first coolant distribution that promotes a substantially uniform temperature across the heat exchanger when the heat exchanger directs coolant in the forward direction.

4. The heat exchanger according to claim 3, in which the first coolant distribution includes (i) a first coolant flow rate through a first coolant channel proximate to said first end and (ii) a second coolant flow rate through a second coolant channel proximate to said second end, wherein the second coolant flow rate is greater than the first coolant flow rate, and wherein the coolant flow rate bias toward the second end of the heat exchanger promotes a substantially uniform temperature across the heat exchanger.

5. The heat exchanger according to claim 3, in which said first plurality of coolant apertures includes at least (i) a first pair of coolant apertures having a first distance extending therebetween, and (ii) a second pair of coolant apertures having a second distance extending therebetween that is smaller than the first distance, wherein the first pair of coolant apertures is positioned nearer to said first coolant port than the second pair of coolant apertures to distribute coolant through at least the first and second pairs of coolant apertures to promote a substantially uniform temperature across the heat exchanger.

6. The heat exchanger according to claim 1, in which said bottom coolant manifold is configured to circulate coolant into the second set of coolant channels in accordance with a second coolant distribution that promotes a substantially uniform temperature across the heat exchanger when the heat exchanger directs coolant in the reverse direction.

7. The heat exchanger according to claim 6, in which the second coolant distribution includes (i) a first coolant flow rate through a first coolant channel proximate to said second end and (ii) a second coolant flow rate through a second coolant channel proximate to said first end, wherein the second coolant flow rate is greater than the first coolant flow rate, and wherein the coolant flow rate bias toward the first end of the heat exchanger channel promotes a substantially uniform temperature across the heat exchanger.

8. The heat exchanger according to claim 1, in which said cooling block comprises:

a first matrix comprising a first series of the plurality of coolant flow channels, a first section of said top coolant manifold, and a first series of said first plurality of coolant apertures; and a second matrix comprising a second series of the plurality of coolant flow channels, a second section of said top coolant manifold, and a second series of said first plurality of coolant apertures, wherein the first matrix is positioned nearer to said first coolant port than the second matrix, and wherein the first and second sections of the top coolant manifold are fluidly connected, to distribute coolant into both of said first and second series of the plurality of coolant flow channels.

9. The heat exchanger according to claim 8, in which said top and bottom coolant manifolds are configured to circulate coolant into the plurality of coolant channels in accordance with a particular coolant distribution defined by (i) a first coolant volume per unit time conveyed through the first series of said plurality of coolant flow channels corresponding to the first matrix, and (ii) a second coolant volume per unit time conveyed through the second series of said plurality of coolant flow channels corresponding to the second matrix, wherein the second coolant volume per unit time is greater than the first coolant volume per unit time, and wherein the coolant volume per unit time bias toward the second matrix promotes a substantially uniform temperature across the heat exchanger.

10. The heat exchanger according to claim 8, in which said first series of first plurality of coolant apertures of said first matrix includes at least (i) a first pair of first plurality of coolant apertures having a first distance extending therebetween, and (ii) a second pair of first plurality of coolant apertures having a second distance extending therebetween that is smaller than the first distance, wherein the first pair of first plurality of coolant apertures is positioned nearer to said first coolant port than the second pair of first plurality of coolant apertures to distribute coolant through at least the first and second pairs of first plurality of coolant apertures to promote a substantially uniform temperature across the heat exchanger, from said first end to said second end.

11. The heat exchanger according to claim 8, in which said top coolant manifold further comprises one or more transition channels extending substantially between said first section of the top coolant manifold and said second section of the top coolant manifold, wherein said one or more transition channels restrict coolant fluid flow between the first and second sections of the top coolant manifold, such that coolant entering the top coolant manifold through said first coolant port is distributed between the first and second sections of the top coolant manifold to promote a substantially uniform temperature across the heat exchanger.

12. The heat exchanger according to claim 11, in which more coolant is distributed from the second section of the top coolant manifold than the first section of the top coolant manifold, into their respective matrixes, when coolant flows in a forward direction from the first coolant port and into the top coolant manifold.

13. The heat exchanger according to claim 11, in which more coolant is distributed to the first section of the top coolant manifold than the second section of the top coolant manifold when coolant flows in a reverse direction from the top coolant manifold and through the first coolant port.

14. The heat exchanger according to claim 11, in which said second series of first plurality of coolant apertures of said second matrix includes at least one aperture that is proximate to the second end and is angled relative to the other coolant apertures of the second series of coolant apertures, to distribute coolant across each aperture of said second series of first plurality of coolant apertures to promote a substantially uniform temperature across the heat exchanger.

15. The heat exchanger according to claim 8, in which said cooling block further comprises:
  a third matrix comprising a third series of the plurality of coolant flow channels, a third section of said top coolant manifold, and a third series of said first plurality of coolant apertures;
  wherein the third matrix is positioned further from said first coolant port than the second matrix, and wherein the second and third sections of the top coolant manifold are fluidly connected, such that said top coolant manifold distributes coolant into the first, second, and third series of the plurality of coolant flow channels.

16. The heat exchanger according to claim 15, in which said top and bottom coolant manifolds are configured to circulate coolant into the plurality of coolant flow channels in accordance with a particular coolant distribution defined by (i) a first coolant volume per unit time distributed into the first series of said plurality of coolant flow channels corresponding to the first matrix, (ii) a second coolant volume per unit time distributed into the second series of said plurality of coolant flow channels corresponding to the second matrix, and (iii) a third coolant volume per unit time distributed into the third series of said plurality of coolant flow channels corresponding to the second matrix, wherein the third coolant volume per unit time is greater than the second volume per unit time, and wherein the second coolant volume per unit time is greater than the first coolant volume per unit time, and wherein the coolant volume per unit time bias toward the third matrix promotes a substantially uniform temperature across the heat exchanger.

17. The heat exchanger according to claim 15, wherein said one or more transition channels are one or more first transition channels, and in which said top coolant manifold further comprises:
  one or more second transition channels extending substantially between said second section of the top coolant manifold and said third section of the top coolant manifold, wherein said one or more second transition channels restrict coolant fluid flow between the second and third sections of the top coolant manifold, such that coolant entering the top coolant manifold through said first coolant port is distributed among the first, second, and third sections of the top coolant manifold to promote a substantially uniform temperature across the heat exchanger.

18. The heat exchanger according to claim 1, further comprising a plurality of cooling fins in contact with and extending from said top plate, said plurality of cooling fins adapted to exchange heat with objects in contact therewith to, in turn, exchange heat with coolant flowing through said plurality of coolant flow channels.

19. The heat exchanger according to claim 1, further comprising one or more support portions integrally formed within said top coolant manifold between the top and middle plates.

20. The heat exchanger according to claim 1, further comprising one or more support portions integrally formed within said bottom coolant manifold between the middle and bottom plates.

21. The heat exchanger according to claim 1, in which said first coolant port comprises an annular sealing block adapted to convey coolant between the top coolant manifold and a coolant rail, for enabling relative motion between the cooling block and the coolant rail.

22. The heat exchanger according to claim 1, in which said second coolant port comprises an annular sealing block adapted to convey coolant between the bottom coolant manifold and a coolant rail, for enabling relative motion between the cooling block and the coolant rail.

23. A thermal management assembly for regulating the temperature of objects using a coolant, said thermal management assembly comprising:
  a first heat exchanger and a second heat exchanger, each comprising:
    a top plate, a bottom plate, and a middle plate operably situated between said top and bottom plates, said top, middle, and bottom plates being sealedly engaged for circulation of said coolant, and collectively forming a stacked cooling block having a first end and a second end substantially opposite the first end, and a manifold side and a recirculation side substantially opposite the manifold side, each of said manifold and recirculation sides being operably positioned between each of said first and second ends, respectively;
    a first coolant port through which coolant is conveyed into or from space formed between the top and middle plates;
    a second coolant port through which coolant is conveyed into or from space formed between the middle and bottom plates;
    a plurality of coolant flow channels extending substantially between said manifold and recirculation sides, said plurality of coolant flow channels comprising a first set of coolant channels formed between the top and middle plates and a second set of coolant channels formed between the bottom and middle plates, wherein the first set of coolant channels and the second set of coolant channels are fluidly connected through one or more recirculation apertures that are formed within said middle plate proximate to said recirculation side, or are defined by space between said top and bottom plates extending beyond an edge of said middle plate;
    a top coolant manifold formed between the top and middle plates proximate to said manifold side and extending substantially between said first end and said second end, said top coolant manifold being adapted to convey coolant through said first coolant port positioned proximate to said first end, and is adapted to direct coolant to and from said first set of coolant channels via a first plurality of coolant apertures positioned therebetween; and a bottom coolant manifold formed between the bottom and middle plates proximate to said manifold side and extending substantially between said first end and said second end, said bottom coolant manifold being adapted to direct coolant to and from said second set of coolant channels and said bottom coolant manifold via a second plurality of coolant apertures positioned therebetween, and adapted to convey coolant through said second coolant port positioned proximate to said second end;

a coolant inlet rail configured to direct coolant into the first and second heat exchangers; and a coolant outlet rail configured to receive coolant from the first and second heat exchangers, wherein the first coolant port of the first heat exchanger is fluidly coupled to the coolant inlet rail, and the second coolant port of the first heat exchanger is fluidly coupled to the coolant outlet rail, wherein the first coolant port of the second heat exchanger is fluidly coupled to the coolant outlet rail, and the second coolant port of the second heat exchanger is fluidly coupled to the coolant inlet rail, and wherein the first and second heat exchangers are of a like component construction and arranged in opposite orientations with respect to each other, while providing substantially similar temperature regulation effects with respect to each other.

\* \* \* \* \*